(12) United States Patent
Kim et al.

(10) Patent No.: US 12,336,130 B2
(45) Date of Patent: Jun. 17, 2025

(54) ELECTRONIC DEVICE INCLUDING REAR PLATE AND METHOD FOR FORMING THE SAME

(71) Applicant: Samsung Electronics Co., Ltd., Gyeonggi-do (KR)

(72) Inventors: Kyunghyun Kim, Gyeonggi-do (KR); Poonggi Jung, Gyeonggi-do (KR); Seonjung Kim, Gyeonggi-do (KR); Hakju Kim, Gyeonggi-do (KR); Jiwoon Lim, Gyeonggi-do (KR); Jongmun Choi, Gyeonggi-do (KR); Hyunsuk Choi, Gyeonggi-do (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 527 days.

(21) Appl. No.: 17/845,041

(22) Filed: Jun. 21, 2022

(65) Prior Publication Data
US 2023/0030545 A1    Feb. 2, 2023

Related U.S. Application Data

(63) Continuation of application No. PCT/KR2022/008283, filed on Jun. 13, 2022.

(30) Foreign Application Priority Data

Jul. 30, 2021   (KR) .................. 10-2021-0100357

(51) Int. Cl.
H05K 5/03       (2006.01)
H05K 5/00       (2006.01)
(52) U.S. Cl.
CPC ............. *H05K 5/03* (2013.01); *H05K 5/0017* (2013.01)

(58) Field of Classification Search
CPC .......... H05K 5/03; H05K 5/0017; H05K 5/00; H05K 5/02; G02B 1/00; G02B 5/02;
(Continued)

(56) References Cited

U.S. PATENT DOCUMENTS 5,555,476 A * 9/1996 Suzuki ................ G02B 3/0068
                                                   349/110
8,164,810 B2   4/2012 Phillips et al.
(Continued)

FOREIGN PATENT DOCUMENTS

CN    110012139 A    7/2019
JP    2019-6051 A    1/2019
(Continued)

OTHER PUBLICATIONS

International Search Report dated Sep. 30, 2022.
Extended European Search Report dated Oct. 17, 2024.

*Primary Examiner* — Arnel C Lavarias
(74) *Attorney, Agent, or Firm* — Cha & Reiter, LLC

(57) ABSTRACT

An electronic device, rear plate, and method of forming the rear plate are disclosed. The electronic device includes a housing including a front plate, the rear plate facing an opposite direction to the front plate, and a side structure surrounding a space formed between the front plate and the rear plate, and a display. The rear plate includes a glass plate and decorative member, the decorative member including a first base plate, a second base plate, a first molding pattern disposed on the first base plate and including a 3-dimensional pattern, a first adhesive layer between the first molding pattern layer and the second base plate, wherein an index of refraction of the first adhesive layer is different from an index of refraction of the first molding pattern, and a shielding printing layer.

20 Claims, 18 Drawing Sheets

(58) Field of Classification Search
CPC .... G02B 5/0205; G02B 5/021; G02B 5/0263;
G02B 5/0268; G02B 5/0273; G02B
5/0284; G02B 5/0294; G02B 5/28; G02B
5/285; G02B 5/286; G02B 5/287; B32B
2307/00; B32B 2307/40; B32B 2307/402;
B32B 2307/4023; B32B 2307/4026;
B32B 2307/404; B32B 2307/409; B32B
2307/41; B32B 2307/412; B32B
2307/414; B32B 2307/416; B32B
2307/418
USPC ....... 359/599, 601, 602, 609, 613, 614, 577,
359/580, 581, 282, 584, 585, 586, 588,
359/589, 590
See application file for complete search history.

(56) References Cited

U.S. PATENT DOCUMENTS

| | | | |
|---|---|---|---|
| 10,031,265 | B2 | 7/2018 | Kwon et al. |
| 10,345,637 | B2 | 7/2019 | Chang et al. |
| 10,981,368 | B2 | 4/2021 | Mitsugi et al. |
| 2004/0032401 | A1* | 2/2004 | Nakazawa .............. G06F 3/045 345/173 |
| 2007/0206249 | A1 | 9/2007 | Phillips et al. |
| 2019/0077134 | A1 | 3/2019 | Konno et al. |
| 2020/0156360 | A1 | 5/2020 | Mitsugi et al. |
| 2020/0198294 | A1 | 6/2020 | Lee et al. |
| 2020/0221589 | A1 | 7/2020 | Han et al. |
| 2021/0347145 | A1 | 11/2021 | Bang et al. |

FOREIGN PATENT DOCUMENTS

| | | | |
|---|---|---|---|
| KR | 10-2007-0091565 | A | 9/2007 |
| KR | 10-2012-0065811 | A | 6/2012 |
| KR | 10-2015-0019502 | A | 2/2015 |
| KR | 10-2017-0001844 | A | 1/2017 |
| KR | 10-2018-0084014 | A | 7/2018 |
| KR | 10-2019-0001281 | A | 1/2019 |
| KR | 10-2020-0034355 | A | 3/2020 |
| KR | 10-2020-0076802 | A | 6/2020 |
| KR | 10-2117321 | B1 | 6/2020 |
| KR | 10-2021-0048222 | A | 5/2021 |
| KR | 10-2022-0048258 | A | 4/2022 |
| WO | WO-2020029575 | A1 * | 2/2020 .............. B32B 27/06 |

* cited by examiner

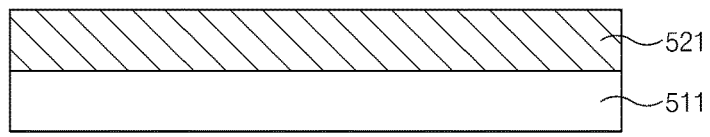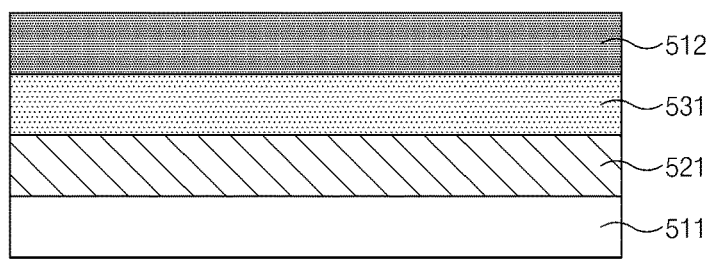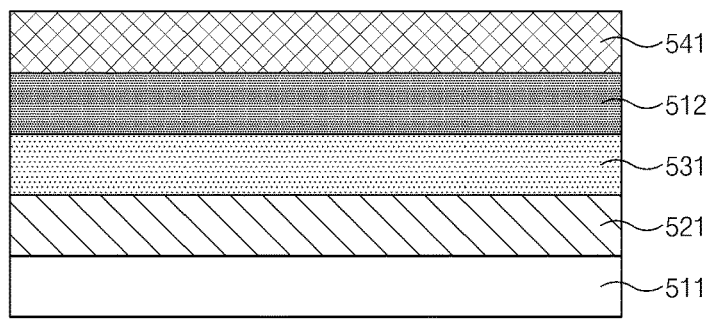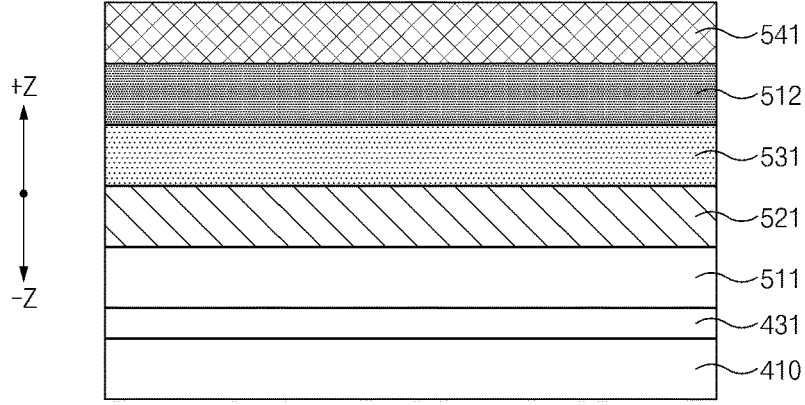
F I G. 8

ELECTRONIC DEVICE INCLUDING REAR PLATE AND METHOD FOR FORMING THE SAME

CROSS-REFERENCE TO RELATED APPLICATION(S)

This application is a Continuation of and based on and claims priority under 35 U.S.C. § 120 to PCT International Application No. PCT/KR2022/008283, which was filed on Jun. 13, 2022, and claims priority to Korean Patent Application No. 10-2021-0100357, filed on Jul. 30, 2021, in the Korean Intellectual Property Office, the disclosures of which are incorporated by reference herein their entirety.

BACKGROUND

Technical Field

Embodiments disclosed in the disclosure relate to an electronic device including a rear plate that creates visual effects via interference with light, and a method for forming the rear plate.

Description of Related Art

Electronic devices have advanced in portability, becoming increasingly slim and light-weight. Further, with the advance of technology, these devices now achieve increasingly higher performance, allowing for development of an even greater diversity of functions and apps.

Recently, electronic devices have increasingly differentiated themselves with more attractive aesthetic design to better appeal to consumers.

SUMMARY

It is desirable to increase the aesthetic appearance and tactile quality of electronic devices to improve consumer appeal of the same, using, for example, a rear plate covering a rear surface of an electronic device.

Accordingly, the present disclosure provides an electronic device having a housing or attachment to housing, which includes the appearance of a diversity of complex patterns and colors according to viewing angle, and/or simple patterns and a single color, and a method for forming the same. certain embodiments A rear plate that covers a rear surface of an electronic device according to certain embodiments disclosed in the disclosure includes a glass plate, a first base plate attached to one surface of the glass plate, a second base plate disposed so as to be spaced apart from the first base plate, a first molding pattern layer disposed on one surface of the first base plate, including a plurality of first 3-dimensional (3D) patterns protruding toward the second base plate, a first adhesive layer disposed between the first molding pattern layer and an opposite surface of the second base plate, wherein an index of refraction of the first adhesive layer is different from an index of refraction of the first molding pattern layer, such that at least a portion of light input through the first molding pattern layer is reflected on an interface with the first molding pattern layer, and a shielding printing layer disposed on one surface of the second base plate.

An electronic device according to an embodiment disclosed the disclosure includes a housing including a housing including a front plate, a rear plate facing an opposite direction to the front plate, and a side structure surrounding a space formed between the front plate and the rear plate, a display visible through at least a portion of the front plate, wherein the rear plate includes a glass plate, and a decorative member attached to the glass plate and facing the display; and wherein the decorative member includes a first base plate attached to one surface of the glass plate, a second base plate disposed so as to be spaced apart from the first base plate, a first molding pattern layer disposed on one surface of the first base plate, and including a plurality of first 3-dimensional (3D) patterns protruding toward the display, a first adhesive layer disposed between the first molding pattern layer and an opposite surface of the second base plate, wherein an index of refraction of the first adhesive layer is different from an index of refraction of the first molding pattern layer such that at least a portion of light that is input through the first molding pattern layer is reflected on an interface with the first molding pattern layer, and a shielding printing layer disposed on one surface of the second base plate.

A method for a rear plate that covers a rear surface of an electronic device according to certain embodiments disclosed in the disclosure includes forming a first molding pattern layer including a plurality of first 3-dimensional (3D) patterns on one surface of a first base plate, forming a first adhesive layer on an opposite surface of a second base plate, the first adhesive layer having an index of refraction different from an index of refraction of the first molding pattern layer, laminating the second base plate on one surface of the first molding pattern layer such that the first adhesive layer and the first molding pattern layer contact each other, and forming a shielding printing layer on one surface of the second base plate, wherein at least a portion of light that is input through the first molding pattern layer is reflected on an interface between the first molding pattern layer and the first adhesive layer.

The electronic device according to the embodiments disclosed in the disclosure may include a rear plate that includes aesthetically appealing colors and textures, without deposition of a thin film layer.

According to the electronic device according to the embodiments disclosed in the disclosure, production cost of the device and/or housing may be decreased by omitting a deposition process in forming the decorative member in a printing process.

The electronic device according to the embodiments disclosed in the disclosure may implement a multi-molding pattern effect through a combination of at least one molding pattern layer and a multi-deposition layer.

The electronic device according to the embodiments disclosed in the disclosure may provide a color material finishing (CMF) quality improving effect.

In addition, the disclosure may provide various effects that are directly or indirectly recognized.

BRIEF DESCRIPTION OF THE DRAWINGS

FIG. 8 is a view illustrating a method for manufacturing the glass structure illustrated in FIG. 5.

With regard to description of drawings, the same or similar components may be marked by the same or similar reference numerals.

DETAILED DESCRIPTION

Hereinafter, certain embodiments of the disclosure will be described with reference to the accompanying drawings. Accordingly, those of ordinary skill in the art will recognize that modification, equivalent, and/or alternative on the certain embodiments described herein can be variously made without departing from the disclosure.

Figure 1:
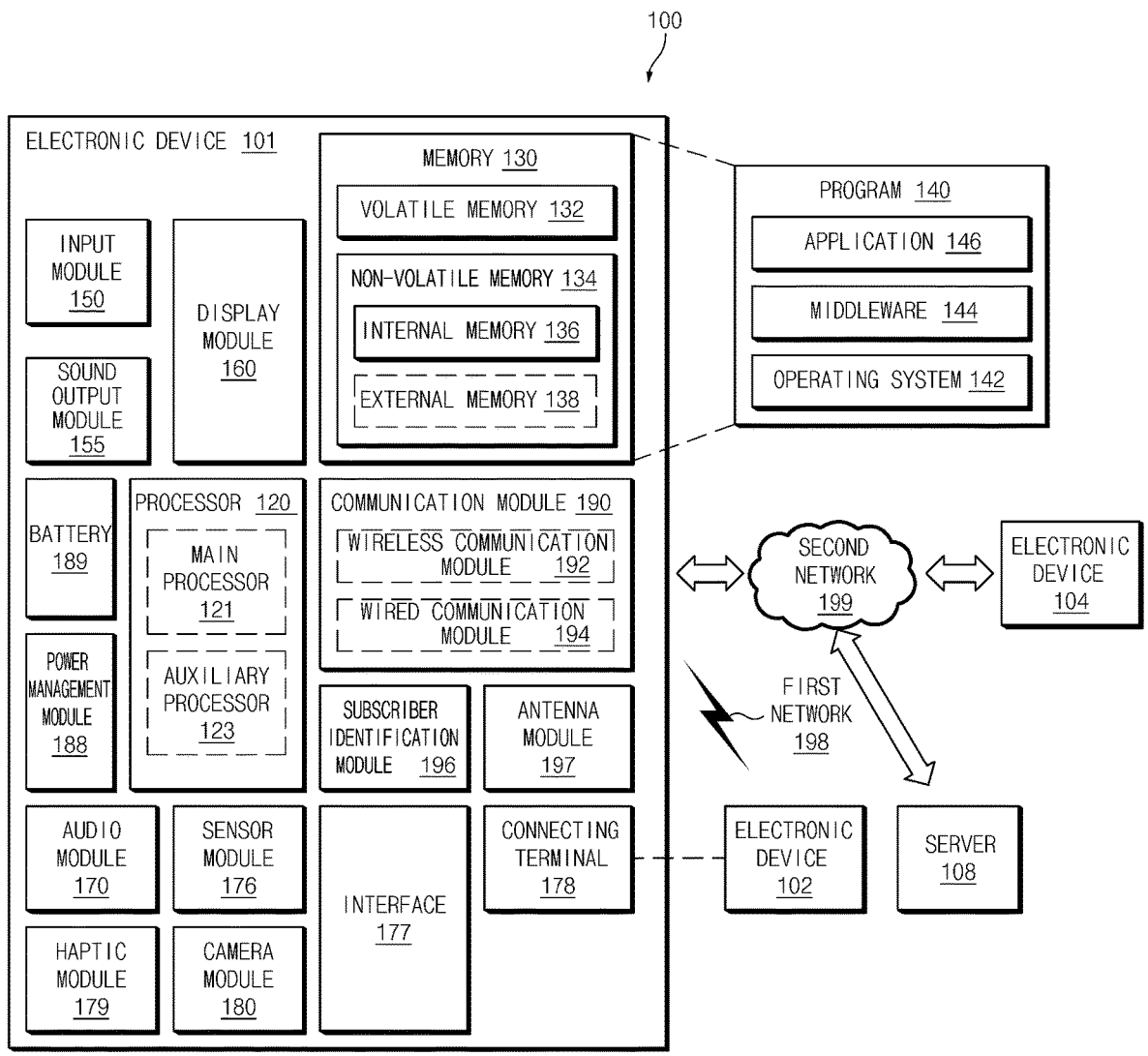
FIG. 1 is a block diagram of an electronic device in a network environment according to certain embodiments.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

An electronic device according to certain embodiments disclosed in the disclosure may include devices of various forms. The electronic devices, for example, may include a portable communication device (e.g., a smart phone), a computer device, a portable multimedia device, a portable medical device, a camera, a wearable device, or a home appliance. An electronic device according to certain embodiments of the disclosure is not limited to the above-mentioned devices.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration.

According to certain embodiments, operations performed by the module, the program, or another component may be carried out sequentially, in parallel, repeatedly, or heuristically, or one or more of the operations may be executed in a different order or omitted, or one or more other operations may be added.

Figure 2A:
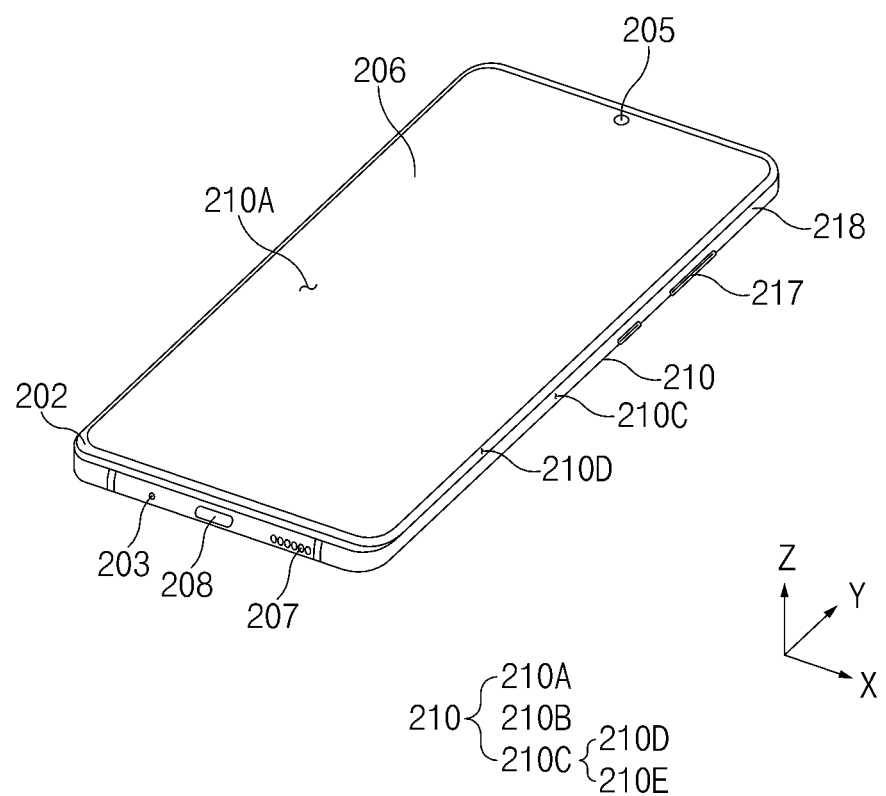
FIG. 2A is a view illustrating a front surface of an electronic device according to certain embodiments of the disclosure.
Figure 2B:
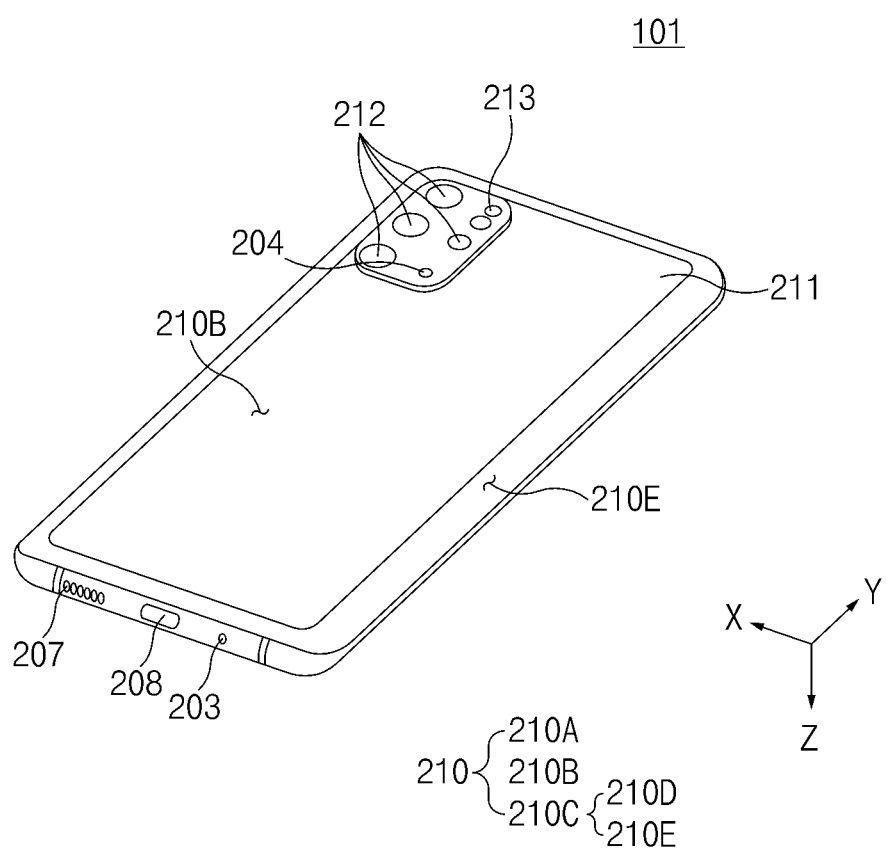
FIG. 2B is a view illustrating a rear surface of the electronic device of FIG. 1 according to certain embodiments of the disclosure.

FIG. 2A is a front perspective view of an electronic according to an embodiment, and FIG. 2B is a rear perspective view of an electronic device according to an embodiment.

Referring to FIGS. 2A and 2B, an electronic device 101 may include a housing 210 including a first surface (or a front surface) 210A, a second surface (or a rear surface) 210B, and side surfaces 210C that surrounds a space between the first surface 210A and the second surface 210B.

In another embodiment (not illustrated), the housing 210 may refer to a structure that defines some of the first surface 210A, the second surface 210B, and the side surfaces 210C.

According to an embodiment, the first surface 210A may be defined by a front plate 202 (e.g., a glass plate or a polymer plate including various coating layers), at least a portion of which is substantially transparent. The second surface 210B may be defined by a substantially opaque rear plate 211. The rear plate 211, for example, may be formed of coated or colored glass, ceramics, a polymer, a metal (e.g., aluminum, stainless steel (STS), or magnesium), or a combination of at least two thereof. The side surfaces 210C may be coupled to the front plate 202 and the rear plate 211, and may be defined by a side bezel structure (or 'a frame structure') 218 including a metal and/or a polymer.

In another embodiment, the rear plate 211 and the side bezel structure 218 may be integrally formed and may include the same material (e.g., a metallic material such as aluminum).

In the illustrated embodiment, the front plate 202 may include two first areas 210D that are deflected from a partial area of the first surface 210A toward the rear plate 211 and extend seamlessly. The first areas 210D may be located at opposite ends of a long edge of the front plate 202.

In the illustrated embodiment, the rear plate 211 may include two second areas 210E that are set at an angle or curve from a partial area of the second surface 210B toward the front plate 202 and extend seamlessly therefrom. The second areas 210E may be included at opposite ends of a long edge of the rear plate 211.

In another embodiment, the front plate 202 (or the rear plate 211) may include one of the first areas 210D (or the second areas 210E). Furthermore, in another embodiment, the front plate 202 (or the rear plate 211) may not include some of the first areas 210D (or the second areas 210E).

In an embodiment, when viewed from a side of the electronic device 101, the side bezel structure 218 may have a first thickness (width) on a lateral side (e.g., a short edge), on which neither the first areas 210D nor the second areas 210E are included, and may have a second thickness that is smaller than the first thickness on a lateral side (e.g., a long edge), on which the first areas 210D or the second areas 210E are included.

According to an embodiment, the electronic device 101 may include at least one of a display 206 (e.g., the display module 160 of FIG. 1), audio modules 203, and 207 (e.g., the audio module 170 of FIG. 1), a sensor module (not illustrated) (e.g., the sensor module 176 of FIG. 1), camera modules 205 and 212 (e.g., the camera module 180 of FIG. 1), a key input device 217 (e.g., the input module 150 of FIG. 1), a light emitting element (not illustrated), and a connector hole 208 (e.g., the connection terminal 178 of FIG. 1). In another embodiment, at least one (e.g., the key input device 217 or the light emitting element (not illustrated)) of the elements may be omitted from the electronic device 101 or another component may be additionally included in the electronic device 101.

In an embodiment, the display 206 may be visually exposed through an almost entire portion of the front plate 202. For example, at least a portion of the display 206 may be exposed through the front plate 202 that defines the first surface 210A, and the first areas 210D of the side surfaces 210C.

In an embodiment, corners of the display 206 may have a shape that is substantially the same as the adjacent outer shape of the front plate 202. In other embodiments (not illustrated), in order to expand the area by which the display 206 is exposed, the intervals between the outskirts of the display 206 and the outskirts of the front plate 202 may be set substantially the same.

In an embodiment, a surface (or the front plate 202) of the housing 210 may include a screen display area that is formed as the display 206 is exposed so as to be visible from an external environment. For example, the screen display area may include the first surface 210A, and the first areas 210D of the side surface.

In another embodiment (not illustrated), the screen display areas 210A and 210D may include a sensing area (not illustrated) configured to acquire biometric information of a user. Here, the expression that "the screen display areas 210A and 210D include a sensing area" may be understood that at least a portion of the sensing area may overlap the screen display areas 210A and 210D. For example, the sensing area (not illustrated) may display visual information on the display 206 like other areas of the screen display areas 210A and 210D, and additionally, may indicate an area that may acquire biometric information (e.g., a fingerprint) of the user.

In another embodiment, the screen display areas 210A and 210D of the display 206 may include an area, in which the first camera module 205 (e.g., a punch hole camera) may be visually exposed. For example, at least a portion of an edge of the exposed area of the first camera module 205 may be surrounded by the screen display areas 210A and 210D.

In an embodiment, the first camera module 205 may include a plurality of camera modules (e.g., the camera module 180 of FIG. 1).

In other embodiments (not illustrated), the display 206 may be coupled to or be disposed to be adjacent to a touch detection circuit, a pressure sensor that may measure the strength (the pressure) of a touch, and/or a digitizer that detects a stylus pen of a magnetic field type.

According to an embodiment, the audio modules 203, 204, and 207 may include the microphone holes and the speaker hole.

In an embodiment, the microphone holes may include the first microphone hole formed in a partial area of the side surfaces 210C, and the second microphone hole formed in a partial area of the second surface 210B. Microphones for obtaining external sound may be disposed in interiors of the microphone holes. The microphones may include a plurality of microphones to sense a direction of sound. In an embodiment, the second microphone hole formed in a partial area of the second surface 210B may be disposed to be adjacent to the camera modules 205 and 212. For example, the second microphone hole may acquire sound during execution of the camera modules 205 and 212 or may acquire sound during execution of another function.

In an embodiment, the speaker hole may include an external speaker hole and a communication receiver hole (not illustrated). The external speaker hole may be formed at a portion of the side surfaces 210C of the electronic device 101. In another embodiment, the external speaker hole and the microphone hole may be implemented with one hole. Although not illustrated, the communication receiver hole (not illustrated) may be formed at another portion of the side surfaces 210C. For example, the communication receiver hole (not illustrated) may be formed at a portion (e.g., a portion that faces the +Y axis direction) of the side surfaces 210C, which faces a portion (e.g., a portion that faces the −Y axis direction) of the side surfaces 210C, at which the external speaker hole 207 is formed.

In an embodiment, the electronic device 101 may include a speaker in communication with the speaker hole. In another embodiment, the speaker may include a piezoelectric speaker, from which the speaker hole may be omitted.

In an embodiment, the sensor module (not illustrated) (e.g., a sensor module 176 of FIG. 1) may generate an electrical signal or a data value corresponding to an operation state of the interior of the electronic device 101 or an environmental state of the outside. For example, the sensor module may include at least one of a proximity sensor, an HRM sensor, a fingerprint sensor, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and an illumination sensor.

In an embodiment, the camera modules 205 and 212 may include the first camera device 205 (e.g., the punch hole camera or an under display camera (UDC)) exposed through the first surface 210A of the electronic device 101, and a second camera module 212 and/or a flash 213 exposed through the second surface 210B.

In an embodiment, the first camera module 205 may be exposed through a portion of the screen display area 210A or 210D of the display 206. For example, the first camera module 205 may be exposed through a partial area of the screen display area 210A or 210D through an opening (not illustrated) formed at a portion of the display 206.

In an embodiment, the second camera module 212 may include a plurality of camera modules (e.g., a dual camera, a triple camera, or a quad camera). However, the second camera module 212 is not limited to necessarily include a plurality of camera modules, and may include one camera module.

The first camera modules 205 and the second camera module 212 may include one or a plurality of lenses, an image sensor, and/or an image signal processor. The flash 213, for example, may include a light emitting diode or a xenon lamp. In another embodiment, two or more lenses (an infrared ray camera, and a wide angle/telephoto lens), and image sensors may be disposed on one surface of the electronic device 101.

In an embodiment, the key input device 217 may be disposed in the side surfaces 210C (e.g., the first areas 210D and/or the second areas 210E) of the housing 210. In another embodiment, the electronic device 101 may not include some or all of the above-mentioned key input devices 217 and the key input devices 217, which are not included, may be realized in different forms, such as a soft key, on the display 206. In another embodiment, the key input device may include a sensor module (not illustrated) that defines a sensing area (not illustrated) included in the screen display areas 210A and 210D.

In an embodiment, the connector hole 208 may accommodate connectors. The connector hole 208 may be disposed on the side surface 210C of the housing 210. For example, the connector hole 208 may be disposed on the side surface 210C to be adjacent to at least a portion of the audio modules (e.g., the microphone hole and the speaker hole). In another embodiment, the electronic device 101 may include a first connector hole 208 that may accommodate a connector (e.g., a USB connector) for transmitting and receiving electric power and/or data to and from an external electronic device and/or a second connector hole (not illustrated) that may accommodate a connector (e.g., an earphone jack) for transmitting and receiving an audio signal to and from the external device.

In an embodiment, the electronic device 101 may include a light emitting element (not illustrated). For example, the light emitting element (not illustrated) may be disposed on the first surface 210A of the housing 210. The light emitting element (not illustrated) may provide state information on the electronic device 101 in the form of light. In another embodiment, the light emitting element (not illustrated) may provide a light source that interworks with an operation of the first camera module 205. For example, the light emitting element (not illustrated) may include an LED, an IR LED, and/or a xenon lamp.

Figure 3:
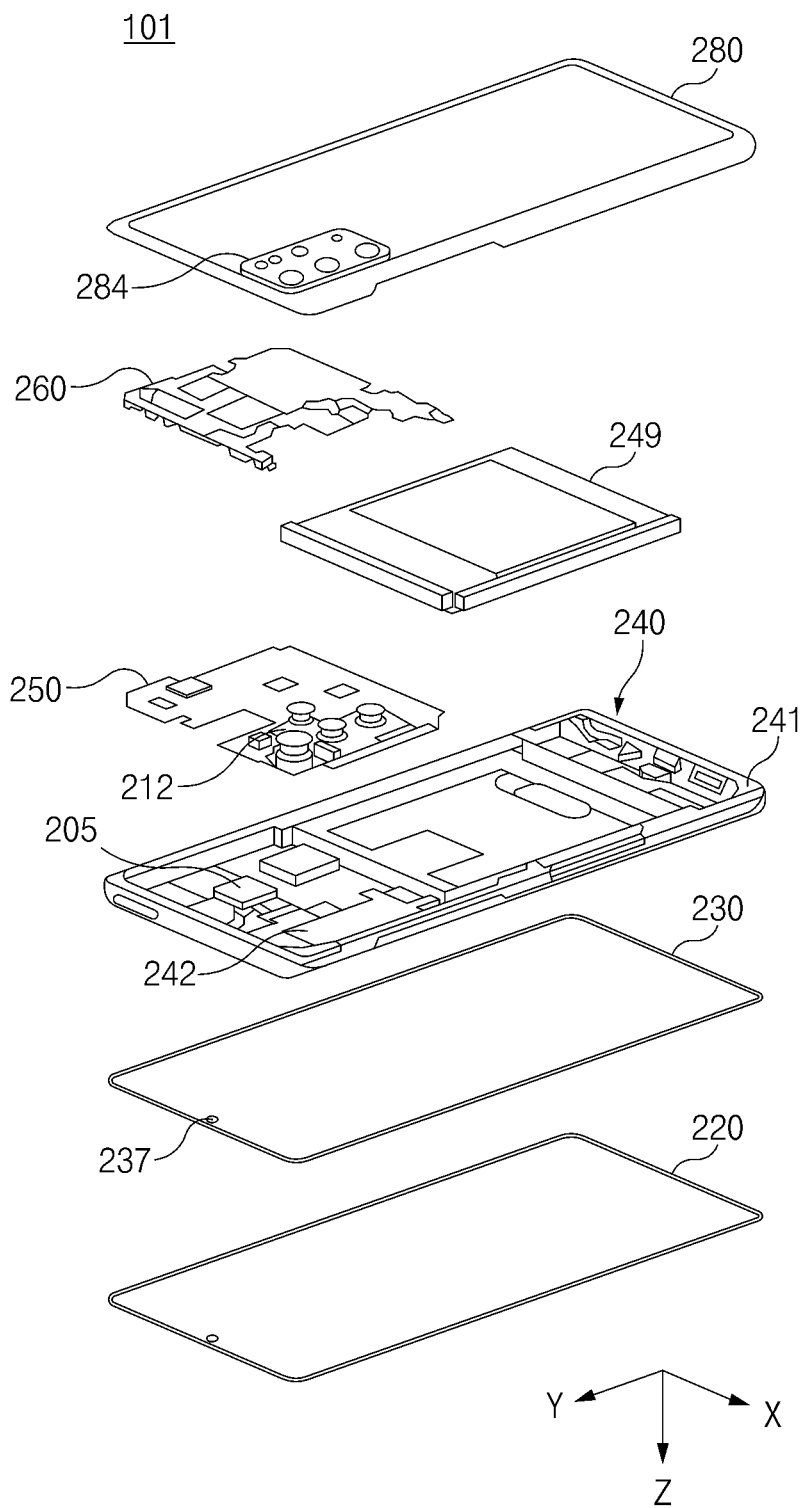
FIG. 3 is an exploded perspective view illustrating an electronic device according to certain embodiments of the disclosure.

FIG. 3 is an exploded perspective view of an electronic device according to an embodiment.

Referring to FIG. 3, the electronic device 101 may include a front plate 220 (e.g., the front surface 210A and the first area 210D of FIG. 2A), a display 230 (e.g., the display 206 of FIG. 2A), a bracket 240, a battery 249, a printed circuit board 250, a support member 260 (e.g., the rear case), and a rear plate 280 (e.g., the rear surface 210B and the second area 210E of FIG. 2A).

In another embodiment, at least one (e.g., the support member 260) of the elements may be omitted from the electronic device 101 or another component may be additionally included in the electronic device 101. At least one of the components of the electronic device 101 may be the same as or similar to at least one of the components of the electronic device 101 of FIGS. 2A and 2B, and a repeated description thereof will be omitted.

In an embodiment, at least some of the front plate 220, the rear plate 280, and the bracket 240 (e.g., a frame structure 241) may define the housing (e.g., the housing 210 of FIGS. 2A and 2B). The rear plate 280 may include at least any one of the rear surface 210B and the second area 210E of FIG. 2A to define an outer surface of the housing. The rear plate 280 may be coupled to the frame structure 241 of the bracket 240.

In an embodiment, the bracket 240 may include the frame structure 241 that defines a surface (e.g., a portion of the side surface 210C of FIG. 2) of the electronic device 101, and a plate structure 242 that extends from the frame structure 241 to an inside of the electronic device 101.

The plate structure 242 may be disposed in an interior of the electronic device 101, and may be connected to the frame structure 241, or be integrally formed with the frame structure 241. The plate structure 242, for example, may be formed of a metallic material and/or a nonmetallic material (e.g., a polymer). The display 230 may be coupled to one surface of the plate structure 242, and the printed circuit board 250 may be coupled to an opposite surface of the plate structure 242. A processor, a memory, and/or an interface may be mounted on the printed circuit board 250. The processor, for example, may include one or more of a central processing unit, an application processor, a graphic processing unit, an image signal processor, a sensor hub processor, or a communication processor.

The memory, for example, may include a volatile and/or nonvolatile memory.

The interface, for example, may include a high definition multimedia interface (HDMI), a universal serial bus (USB), an SD card interface, and/or an audio interface. The interface, for example, may electrically or physically connect the electronic device 101 to an external electronic device, and may include a USB connector, an SD card/MMC connector, and an audio connector.

In an embodiment, the battery 249 may supply electric power to at least one of the elements of the electronic device 101. For example, the battery 249 may include a primary cell (e.g., that cannot be recharged), a secondary cell, or a fuel cell. In an embodiment, at least a portion of the battery 249 may be disposed on a plane that is substantially the same as that of the printed circuit board 250. In an embodiment, the battery 249 may be integrally disposed within the interior of the electronic device 101 or may be disposed so as to be detachable from the electronic device 101.

In an embodiment, the first camera module 205 may be disposed in the plate structure 242 of the bracket 240 such that the lens is exposed through a partial area of the front plate 220 (or the front surface 210A of FIG. 1) of the electronic device 101.

In an embodiment, the first camera module 205 may be disposed such that an optical axis of the lens is at least partially aligned with a hole or a recess 237 formed in the display 230. For example, an area, in which the lens is exposed, may be formed in the front plate 220. For example, the first camera module 205 may include a punch hole camera disposed in an interior of the hole or the recess 237 formed on the rear surface of the display 230. As another example, additionally or alternatively, the first camera module 205 may include an under display camera (UDC) that is disposed in a lower space (e.g., a space that faces an interior of the electronic device 101 from the display 230) of the display 230.

In an embodiment, the second camera module 212 may be disposed in the printed circuit board 250 such that the lens is exposed through a camera area 284 of the rear plate 280 (or the rear surface 210B of FIG. 2B) of the electronic device 101.

In an embodiment, the camera area 284 may be formed on a surface (e.g., the rear surface 210B of FIG. 2B) of the rear plate 280. In an embodiment, the camera area 284 may be at least partially transparent such that external light reaches the lens of the second camera module 212. In an embodiment, at least a portion of the camera area 284 may protrude from the surface of the rear plate 280 by a specific height. However, the embodiment is not limited thereto, and the camera area 284 may define a plane that is substantially the same as the surface of the rear plate 280.

The electronic device according to certain embodiments disclosed in the disclosure may include an electronic device, such as a bar type, a foldable type, a rollable type, a sliding type, a wearable type, a tablet PC, and/or a notebook PC. The electronic device according to certain embodiments disclosed in the disclosure is not limited to the above-described example, and may include other various electronic devices.

Figure 4:
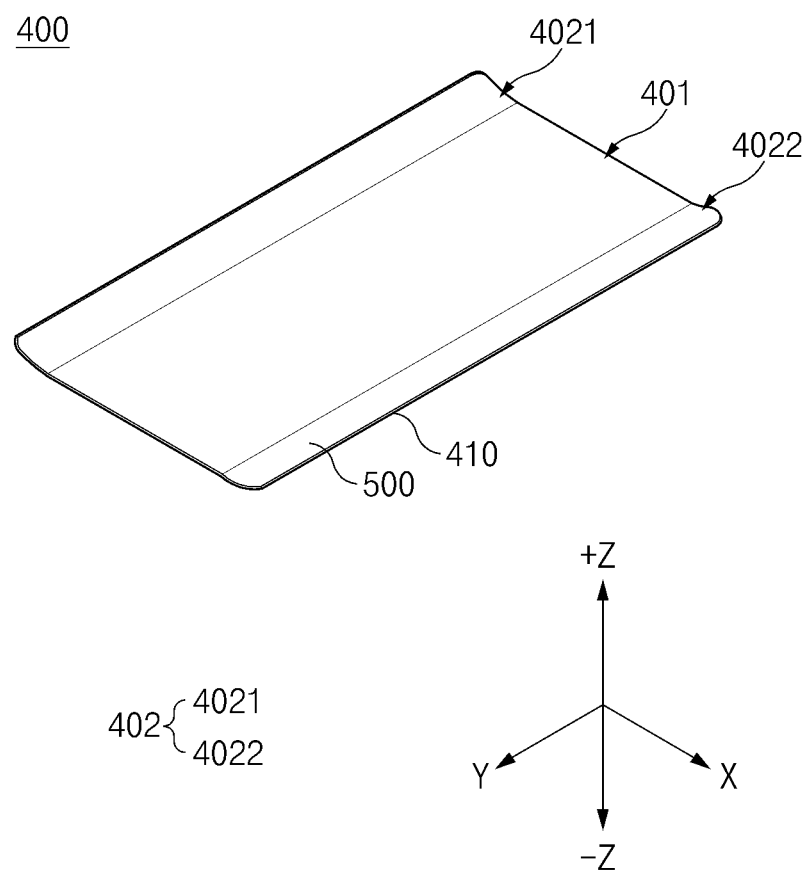
FIG. 4 is a perspective view illustrating a glass structure of an electronic device according to certain embodiments.
Figure 5:
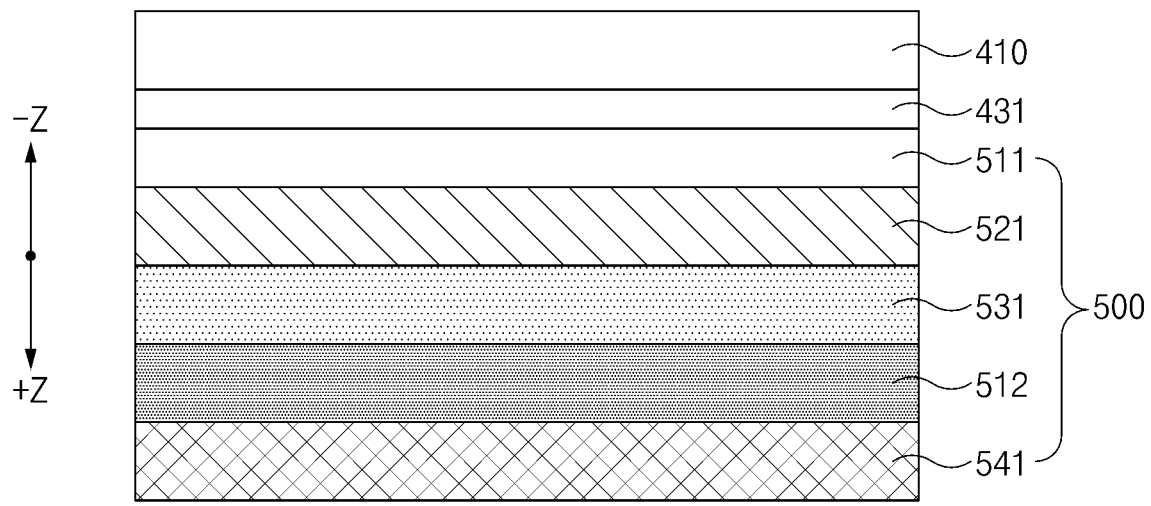
FIG. 5 is a cross-sectional view illustrating a first embodiment of a glass structure of an electronic device according to certain embodiments.

FIG. 4 is a perspective view illustrating a glass structure of an electronic device according to certain embodiments. FIG. 5 is a cross-sectional view illustrating a first embodiment of a glass structure of an electronic device according to certain embodiments. The glass structure of FIGS. 4 and 5 may be at least partially similar to the front plate or the rear plate illustrated in FIGS. 1 to 3 or may include other embodiments. FIG. 5 may be a view illustrating an example of applying the glass structure to at least any one of a flat area and a curved area of the rear plate.

Referring to FIGS. 4 and 5, a glass structure 400 according to certain embodiments may cover a rear surface of the electronic device (e.g., the electronic device 101 of FIGS. 1 to 3). The glass structure 400 may include a rear plate applied to the remaining areas other than optical components, for example, a camera and a sensor. The glass structure 400 may include a glass plate 410, and a decorative member 500 attached to one surface (e.g., a surface facing +Z axis) of the glass plate 410.

The glass plate 410 may cover the rear surface of the electronic device, and at least a portion thereof may be formed of a transparent glass material. At least a portion of the glass plate 410 may include a curved surface. The glass plate 410 may include a flat area 401, and a curved area 402 that extends from the flat area 401 and defines a curved surface.

The flat area 401 may be a central area of the glass plate 410, and the curved area 402 may be formed at an edge area of the glass plate 410 with respect to the flat area 401. According to an embodiment, the curved area 402 may have a closed loop shape that surrounds the flat area 401. For example, four curved areas 402 may be formed when the flat area 401 has a rectangular shape. According to another embodiment, the plurality of curved areas 402 may extend from a partial area of the flat area 401 to face each other. For example, the curved areas 402 may include a first curved area 4021 and a second curved area 4022. The first curved area 4021 and the second curved area 4022 may be portions of an end area of the rear plate (e.g., the rear plate 280 of FIG. 3). The first curved area 4021 and the second curved area 4022 may have a curved structure that is curved seamlessly in a forward direction (the +Z axis direction) facing the display (e.g., the display 230 of FIG. 3). The first curved area 4021 and the second curved area 4022 may not be formed at opposite ends of the glass plate 410, which are located along a widthwise direction (the X axis direction) thereof, but are formed at opposite ends of the glass plate 410, which are located along a lengthwise direction (e.g., the Y axis direction) thereof. The first curved area 4021 may be formed by bending a left area thereof with respect to the flat area 401. The second curved area 4022 may be formed by bending a right area thereof with respect to the flat area 401. The first curved area 4021 and the second curved area 4022 may have the same or different curvatures.

According to certain embodiments, the decorative member 500 may be disposed between the glass plate 410 and the bracket (e.g., the bracket 240 of FIG. 3). The decorative member 500 may include a first base plate 511, a second base plate 512, a first molding pattern layer 521, a reflective adhesive layer 531 (or a first adhesive layer), and a shielding printing layer 541. The decorative member 500 may be attached to one surface (e.g., a surface that faces the +Z axis) of the glass plate 410 through an optical adhesive layer 431 (or a second adhesive layer). The decorative member 500 may be formed as a film.

At least any one of the first base plate 511 and the second base plate 512 may include a certain degree of flexibility, in contrast to the glass plate 410. At least any one of the first base plate 511 and the second base plate 512 may be formed so as to have a sufficient degree of optical performance, including permeability and a non-polarization. At least any one of the first base plate 511 and the second base plate 512 may be formed of various materials, such as polyethylene terephthalate (PET), polymethylmethacrylate (PMMA), or polycarbonate (PC). For example, at least any one of the first base plate 511 and the second base plate 512 may be formed of at least any one of a layer, on which a PC layer and a PMMA layer are laminated, a PET single layer, a PC single layer, a PMMA single layer, an optical PC sheet, a layer including PMMA and a special PMMA copolymer, a polyimide (PI) sheet, a layer including PC and a PI copolymer, and a layer including PMMA and a PI copolymer.

According to an embodiment, the first base plate 511 and the second base plate 512 may include a transparent or opaque color. For example, at least any one of the first base plate 511 and the second base plate 512 may include various colors, which may be generated by applying a surface treatment such as color priming to a surface of the PET layer.

According to an embodiment, the optical adhesive layer 431 (i.e., used for joining with the glass plate 410) may be disposed on an opposite surface (e.g., a surface that faces the −Z axis direction) of the first base plate 511. For example, the optical adhesive layer 431 may be formed of an optical adhesive material such as an optical clear adhesive (OCA) or an optical clear resin (OCR). The first molding pattern layer 521 formed through printing, imprinting, and/or curing may be disposed on one surface (e.g., a surface that faces the +Z axis direction) of the first base plate 511. The optical adhesive layer 431 may have a transparent or opaque color.

According to an embodiment, the reflective adhesive layer 531 for joining with the first molding pattern layer 521 may be disposed on an opposite surface (e.g., a surface that faces the −Z axis direction) of the second base plate 512. The shielding printing layer 541 formed through printing may be disposed on one surface (e.g., a surface that faces the +Z axis direction) of the second base plate 512.

The reflective adhesive layer 531 may include an index of refraction that is different from that of the first molding pattern layer 521. Because light is reflected on an interface between the first molding pattern layer 521 and the reflective adhesive layer 531 due to a difference between the indices of refraction of the first molding pattern layer 521 and the reflective adhesive layer 531, the visibility of a first 3-dimensional patterns 610 of the first molding pattern layer 521 may be increased.

The reflective adhesive layer 531 may increase in durability via sufficient bonding force, and may have optically transparent, opaque, and uniform characteristics. The reflective adhesive layer 531 may be formed of a polymer material, such as acryl, silicon, or urethane, which is transparent or a translucent color. For example, the reflective adhesive layer 531 may be formed of an optical adhesive material such as an optical clear adhesive (OCA) or an optical clear resin (OCR). As an example, the reflective adhesive layer 531 may be formed of an acryl-based polymer that is cured through an optical curing process (e.g., UV curing), but the disclosure is not limited thereto. The reflective adhesive layer 531 may be formed of a material that is the same as or different from that of the optical adhesive layer 431.

According to an embodiment, as a degree of difference increases between the indices of refraction of the reflective adhesive layer 531 and the first molding pattern layer 521, a visibility of a pattern of the first molding pattern layer 521 may also increase. When the difference between the indices of refraction of the reflective adhesive layer 531 and the first molding pattern layer 521 is about 0.1 or more, a visible pattern may appear to an observer. For example, the first molding pattern layer 521 may have an index of refraction of 1.4, and the reflective adhesive layer 531 may have an index of refraction of 1.5.

The shielding printing layer 541 may be implemented via usage of a dark color such as black, and thus may prevent external light from penetrating into the interior of the electronic device (e.g., the electronic device 101 of FIGS. 1 to 3). Furthermore, the decorative member 500 may implement a metallic texture or a ceramic texture through the shielding printing layer 541. The shielding printing layer 541 may be formed by printing a heat-resistant ink in at least a partial area of one surface (e.g., a surface that faces the +Z axis direction) of the second base plate 512 at least once through a method such as screen printing. As an example, the shielding printing layer 541 may be formed by printing the heat-resistant ink on one surface of the second base plate 512, except for a logo area, at least once through a method such as screen printing. According to an embodiment, the shielding printing layer 541 may be omitted.

According to an embodiment, the decorative member 500 may provide a visual effect of a single pattern by the first molding pattern layer 521 to a user. Furthermore, the decorative member 500 may implement a single color or a complex color according to a color of at least any one of the first base plate 511, the second base plate 512, the reflective adhesive layer 531, and the shielding printing layer 541.

Figure 6A:
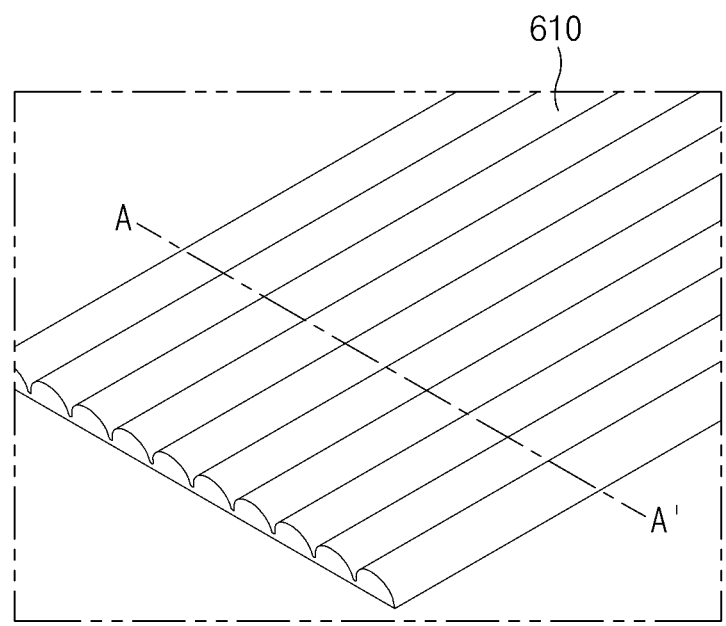
FIGS. 6A and 6B are views illustrating a first molding pattern layer illustrated in FIG. 5 in detail.
Figure 6B:
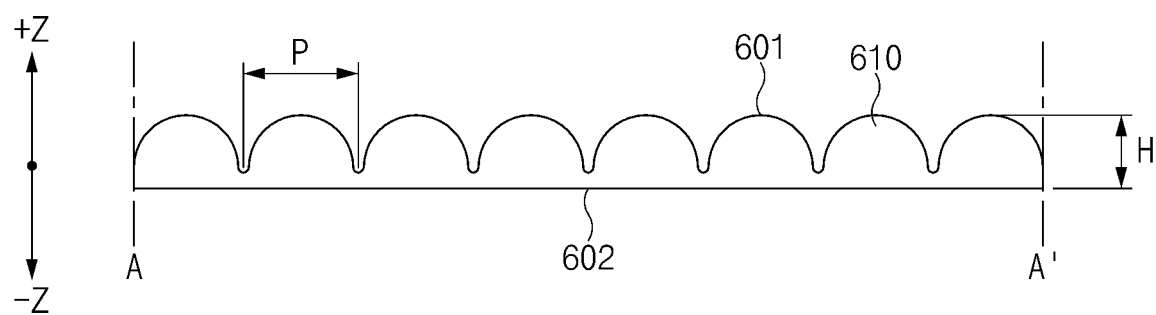

FIG. 6A is a perspective view illustrating an embodiment of the first molding pattern layer illustrated in FIG. 5, and FIG. 6B is a cross-sectional view illustrating the first molding pattern layer, taken along line A-A of FIG. 6A.

Referring to FIGS. 6A and 6B, the first molding pattern layer 521 may be cured through an optical curing process (e.g., UV curing) during formation. The first molding pattern layer 521 may include a plurality of first 3-dimensional patterns 610 disposed on one surface of the first base plate 511. The first molding pattern layer 521 may increase visibility of various patterns and/or textures by diffracting, interfering with, and reflecting light in various directions along the plurality of first 3-dimensional patterns 610. In the first molding pattern layer 521, the plurality of first 3-dimensional patterns 610 may be regularly or irregularly formed in various designs. The plurality of first 3-dimensional patterns 610 included in the first molding pattern layer 521 may be formed in 2D or 3D. The plurality of first 3-dimensional patterns 610 included in the first molding pattern layer 521 may be formed in a lenticular pattern, a prism pattern, a pattern with a plurality of repeated stripes, or a pattern with a plurality of repeated dots. For example, as illustrated in FIGS. 6A and 6B, the first molding pattern layer 521 may have a lattice structure, in which the first 3-dimensional patterns 610 formed in a lenticular pattern are repeated. The first 3-dimensional patterns 610 formed in the lenticular pattern may be repeated at a pitch "P" of about 30 µm, and the first 3-dimensional patterns 610 may have heights of about 2 µm to 9 µm. The first molding pattern layer 521 may be formed at the same height in the same area. According to an embodiment, a visual surface texture of the rear plate (e.g., the rear plate 280 of FIG. 3) may be implemented by adjusting at least any one of a height and a density of the first 3-dimensional patterns 610 included in the first molding pattern layer 521.

The first 3-dimensional patterns 610 of the first molding pattern layer 521 may include a protruding surface 601 (e.g., protrusions) that protrudes from a flat surface 602 that contacts the first base plate 511 in a direction (e.g., the +Z axis direction) that faces the interior of the electronic device. The protruding surface 601 may contact the reflective adhesive layer 531. When the light passes through the flat surface 602 of the first molding pattern layer 521 and reaches the protruding surface 601, the first 3-dimensional patterns 610 may implement a visual surface texture that increases the visibility of single-colored rays of light, by separating light into a spectrum (i.e., according to the wavelengths thereof) via diffraction.

According to an embodiment, the first 3-dimensional patterns 610 of the first molding pattern layer 521 may be formed on an entire surface or at least a portion of the first base plate 511. According to an embodiment, sizes of the first 3-dimensional patterns 610 of the first molding pattern layer 521 may be the same or may be different according to areas. For example, the sizes of the first 3-dimensional patterns 610 of the first molding pattern layer 521 may change gradually when progressing from one side to an opposite side of the first base plate 511, or change gradually progressing from a central portion to an outskirt portion of the first base plate 511.

Figure 7:
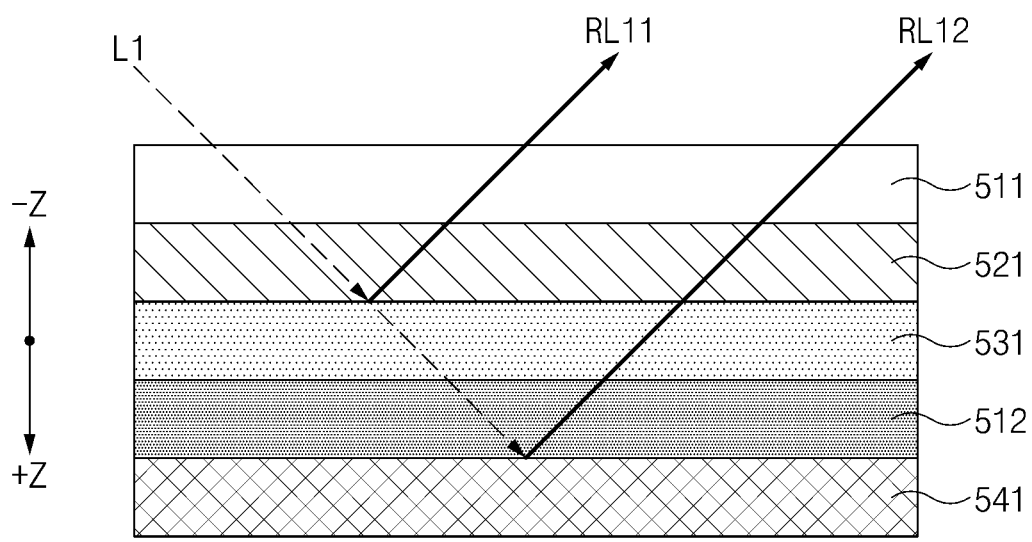
FIG. 7 is a view illustrating an output path of light that is input to a decorative member included in the glass structure illustrated in FIG. 5.

FIG. 7 is a view illustrating an output path of light that is input to a decorative member included in the glass structure illustrated in FIG. 5.

Referring to FIG. 7, light from an outside of the electronic device (e.g., the electronic device 101 of FIGS. 1 to 3) may be input to the glass structure (e.g., the glass structure 400 of FIG. 5). A portion of input light L1 may pass through the first base plate 511 and the first molding pattern layer 521 to reach an interface between the first molding pattern layer 521 and the reflective adhesive layer 531. A portion of the input light L1 that reaches the interface may be reflected on the interface between the first molding pattern layer 521 and the reflective adhesive layer 531 due to the difference between the indices of refraction of the first molding pattern layer 521 and the reflective adhesive layer 531. A first reflected light RL11 reflected on the interface between the first molding pattern layer 521 and the reflective adhesive layer 531 may be output to the outside of the electronic device through the glass structure to provide a visual effect to the user.

Furthermore, a portion of the input light L1 that reaches the interface between the first molding pattern layer 521 and the reflective adhesive layer 531 may be refracted on the interface between the first molding pattern layer 521 and the reflective adhesive layer 531. Then, the input light L1 may include different indices of refraction according to wavelength bands thereof, and the light may be dispersed due to a difference of the respective paths. The refracted input light L1 may pass through the reflective adhesive layer 531 and the second base plate 512 and reach an interface between the shielding printing layer 541 and the second base plate 512. The input light L1 that reached the interface between the shielding printing layer 541 and the second base plate 512 may be reflected by the shielding printing layer 541. A second reflected light RL12 reflected by the shielding printing layer 541 may be output to the outside of the electronic device through the glass structure to provide a visual effect to the user.

According to certain embodiments, through the glass plate (e.g., the glass plate 410 of FIG. 5), a color of the first reflected light RL11 reflected on the interface between the first molding pattern layer 521 and the reflective adhesive layer 531, and a color of the second reflected light RL12 reflected by the shielding printing layer 541 may be viewed together. Accordingly, through the glass structure (e.g., the glass structure 400 of FIG. 5), a visual effect of implementing at least two different colors may be visible to the user. Light of a desired color may be selectively reflected and output by adjusting a thickness and the number of layers of at least one of the first base plate 511, the second base plate 512, the first molding pattern layer 521, the reflective adhesive layer 531, and the shielding printing layer 541 included in the decorative member 500.

According to certain embodiments, the glass plate 410, the optical adhesive layer 431, the first base plate 511, and the first molding pattern layer 521 may be formed to have the same or similar indices of refraction. Accordingly, light may not be reflected, or an amount of reflected light may be reduced in the interface between the glass plate 410 and the optical adhesive layer 431, the interface between the optical adhesive layer 431 and the first base plate 511, and the interface between the first base plate 511 and the first molding pattern layer 521, and thus may not be visible to the user. Furthermore, the reflective adhesive layer 531 and the second base plate 512 may be formed to have the same or similar indices of refraction. Accordingly, light may not be reflected or an amount of reflected light may be reduced on the interface between the reflective adhesive layer 531 and the second base plate 512, and thus may not be visible to the user.

FIG. 8 is a view illustrating a method for manufacturing the glass structure illustrated in FIG. 5.

In operation 801, an optically curing resin may be applied on one surface (e.g., a surface that faces the +Z axis direction) of the first base plate 511. The applied optically curing resin may be optically cured after being imprinted through the optical pattern mold to form the first molding pattern layer 521.

In operation 802, a film or a liquid type adhesive is applied onto an opposite surface (e.g., a surface that faces the −Z axis direction) of the second base plate 512 so as to form the reflective adhesive layer 531. The second base plate 512, in which the reflective adhesive layer 531 is formed on the opposite surface, may be laminated on the first molding pattern layer 521.

According to another embodiment, a film or a liquid type adhesive is applied onto one surface (e.g., a surface that faces the +Z axis direction) of the first molding pattern layer 521 to form the reflective adhesive layer 531. The second base plate 512 may be laminated on one surface of the reflective adhesive layer 531 in the form of a film.

In operation 803, a shielding material may be printed on one surface (e.g., a surface that faces the +Z axis direction) of the second base plate 512 to form the shielding printing layer 541. The shielding printing layer 541 may be formed through a screen printing method.

In operation 804, the optical adhesive layer 431 may be formed on an opposite surface (e.g., a surface that faces the −Z axis direction) of the first base plate 511. The glass plate 410 coupled to the first base plate 511 may be formed through the optical adhesive layer 431.

According to certain embodiments, the decorative member 500 may be manufactured easily through three processes, such as an imprinting process, a lamination process, and a printing process, without any deposition process, and thus productivity may be enhanced.

According to certain embodiments, at least any one of the first molding pattern layer 521, the shielding printing layer 541, and the reflective adhesive layer 531 included in the decorative member 500 may be formed without using a deposition process, such as an electron (E)-beam evaporation. Accordingly, in certain embodiments, by omitting costly vacuum deposition equipment, manufacturing investments and costs may be reduced. Furthermore, in certain embodiments, by omitting the formation vacuum when the decorative member 500 is manufacture, reductions in productivity and yield rate may be reduced. Furthermore, because it is not necessary to control deposition thickness when the decorative member 500 is formed, reductions in a color reproducing performance may be reduced.

Figure 9:
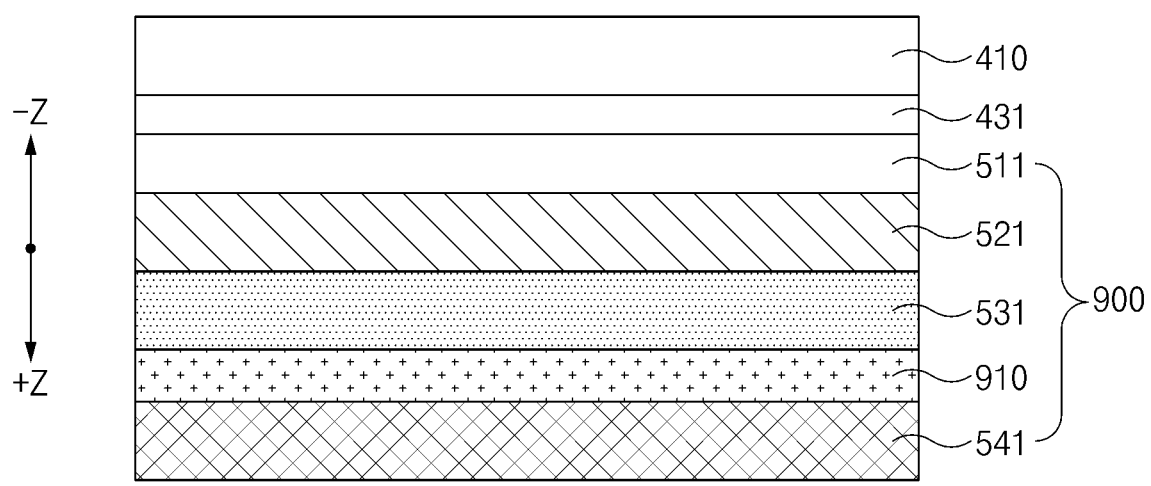
FIG. 9 is a cross-sectional view illustrating a second embodiment of a glass structure of an electronic device according to certain embodiments.
Figure 10:
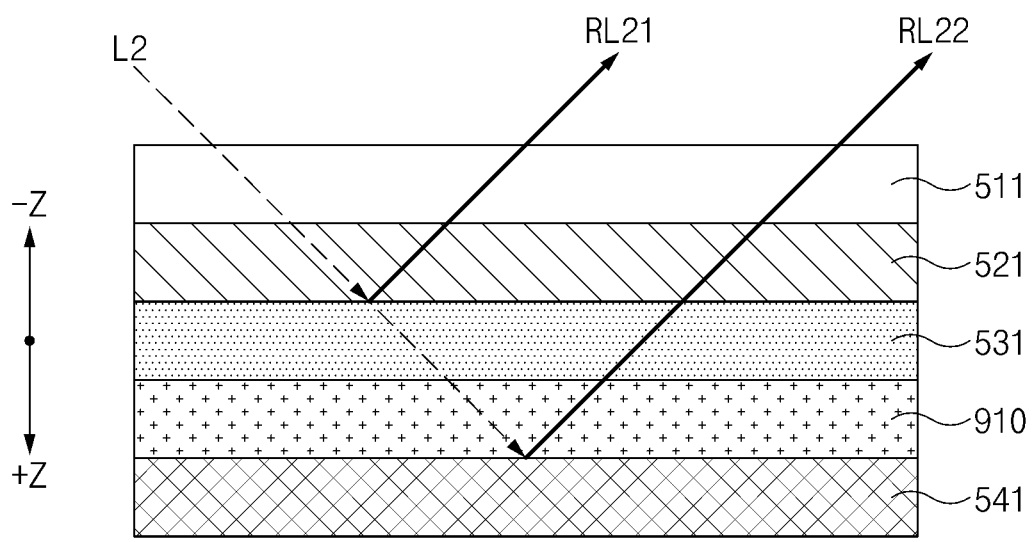
FIG. 10 is a view illustrating an output path of light that is input to a decorative member included in the glass structure illustrated in FIG. 9.

FIG. 9 is a cross-sectional view illustrating a second embodiment of a glass structure 1000 of an electronic device according to certain embodiments. FIG. 10 is a view illustrating an output path of light that is input to a decorative member included in the glass structure illustrated in FIG. 9. The glass plate 410, the optical adhesive layer 431, the first base plate 511, the first molding pattern layer 521, the reflective adhesive layer 531, and the shielding printing layer 541 of FIGS. 9 and 10 are the same as those described with reference to FIGS. 4 to 7, and thus the same reference numerals are given and the same description will be omitted.

Referring to FIGS. 9 and 10, the glass structure 1000 may be formed by attaching a decorative member 900 on one surface (e.g., a surface that faces the +Z axis direction) of the glass plate 410 through the optical adhesive layer 431. The decorative member 900 may include the first base plate 511, the first molding pattern layer 521, the reflective adhesive layer 531, a hard coating layer 910 that is the second base plate, and the shielding printing layer 541.

The hard coating layer 910 may be disposed between the shielding printing layer 541 and the reflective adhesive layer 531. One surface of the hard coating layer 910 may contact the shielding printing layer 541, and an opposite surface of the hard coating layer 910 may contact the reflective adhesive layer 531.

The hard coating layer 910 may be formed of a transparent or colored optically curing or thermally curing material. The hard coating layer 910 may include a sufficient degree of hardness while retaining a degree of flexibility so as to prevent cracks from being generated in the flat area (e.g., the flat area 401 of FIG. 4) and the curved area (e.g., the curved area 402 of FIG. 4) of the glass plate 410. For example, the hard coating layer 910 may be formed of a hard-coating material, such as acrylate, which has a hardness that is higher than that of the first base plate 511.

According to an embodiment, a thickness of the hard coating layer 910 may be smaller than that of the first base plate 511. Even though the thickness of the hard coating layer 910 is smaller than that of the first base plate 511, a hardness of the hard coating layer 910 may be the same as or similar to that of the first base plate 511 or be higher than that of the first base plate 511.

A total thickness of the decorative member 900 including the hard coating layer 910 may be smaller than a total thickness of the decorative member 500 of FIG. 5 including the second base plate 512 formed of the flexible material like the first base plate 511. Accordingly, through the decorative member 900 including the hard coating layer 910, the glass structure 1000 may include properties such as being lightweight, slim and compact.

According to an embodiment, light may be input to the glass structure 1000 including the hard coating layer 910 from the outside of the electronic device. A portion of input light L2 may pass through the first base plate 511 and the first molding pattern layer 521 to reach an interface between the first molding pattern layer 521 and the reflective adhesive layer 531. A portion of the input light L2 that reached the interface between the first molding pattern layer 521 and the reflective adhesive layer 531 may be reflected on the interface between the first molding pattern layer 521 and the reflective adhesive layer 531 due to a difference between the indices of refraction of the first molding pattern layer 521 and the reflective adhesive layer 531. A first reflected light RL21 reflected on the interface between the first molding pattern layer 521 and the reflective adhesive layer 531 may be output to the outside of the electronic device through the glass structure 1000 to provide a visual effect to the user.

Furthermore, a portion of the input light L2 that reaches the interface between the first molding pattern layer 521 and the reflective adhesive layer 531 may be refracted on the interface between the first molding pattern layer 521 and the reflective adhesive layer 531. The refracted input light L2 may pass through the reflective adhesive layer 531 and the hard coating layer 910 and reach an interface between the shielding printing layer 541 and the hard coating layer 910. The input light L2 that reaches the interface between the shielding printing layer 541 and the hard coating layer 910 may be reflected by the shielding printing layer 541. A second reflected light RL22 reflected by the shielding printing layer 541 may be output to the outside of the electronic device through the glass structure 1000 to provide a visual effect to the user.

According to certain embodiments, through the glass plate (e.g., the glass plate 410 of FIG. 5), a color of the first reflected light RL21 reflected on the interface between the first molding pattern layer 521 and the reflective adhesive layer 531 and a color of the second reflected light RL22 reflected by the shielding printing layer 541 may be viewed together. Accordingly, through the glass structure (e.g., the glass structure 400 of FIG. 5), a visual effect including at least two different colors may be visible to the user. Light of a desired color may be selectively reflected and output by adjusting a thickness and the number of layers of at least one of the first base plate 511, the hard coating layer 910, the first molding pattern layer 521, the reflective adhesive layer 531, and the shielding printing layer 541 included in the decorative member 900.

According to an embodiment, the decorative member 900 may provide a visual effect of a single pattern by the first molding pattern layer 521 to a user. Furthermore, the decorative member 900 may implement a single color or a complex color according to a color of at least any one of the first base plate 511, the hard coating layer 910, the reflective adhesive layer 531, and the shielding printing layer 541.

Figure 11:
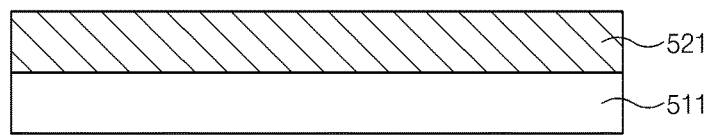
FIG. 11 is a view illustrating a method for manufacturing the glass structure illustrated in FIG. 9.
Figure 11:
Figure 11:
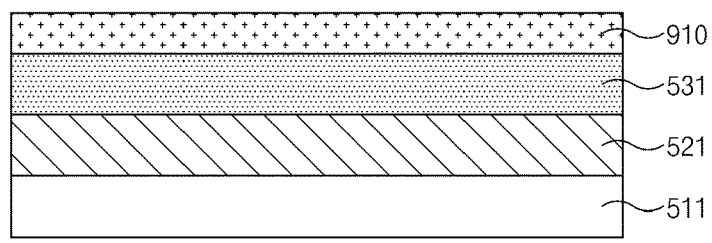
Figure 11:
Figure 11:
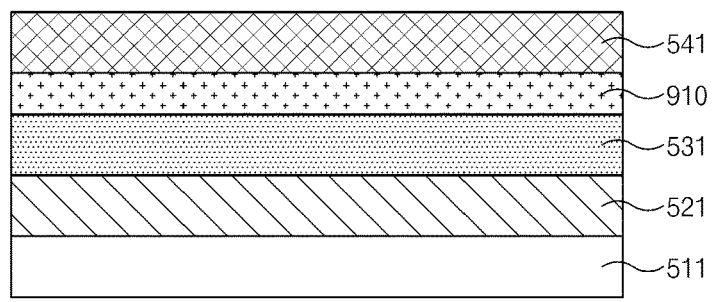
Figure 11:
Figure 11:
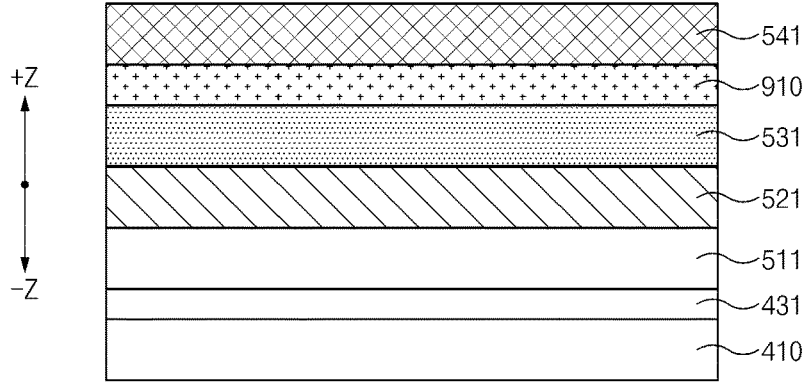

FIG. 11 is a view illustrating a method for manufacturing the glass structure illustrated in FIG. 9.

In operation 1101, an optically curing resin may be applied on one surface (e.g., a surface that faces the +Z axis direction) of the first base plate 511. The applied optically curing resin may be optically cured after being imprinted through the optical pattern mold to form the first molding pattern layer 521.

In operation 1102, a film or a liquid type adhesive is applied onto an opposite surface (e.g., a surface that faces the −Z axis direction) of the hard coating layer 910 to form the reflective adhesive layer 531. The hard coating layer 910, in which the reflective adhesive layer 531 is formed on the opposite surface, may be laminated on the first molding pattern layer 521.

According to another embodiment, a film or a liquid type adhesive is applied onto one surface (e.g., a surface that faces the +Z axis direction) of the first molding pattern layer 521 to form the reflective adhesive layer 531. The hard coating layer 910 in a form of a film may be laminated on one surface of the reflective adhesive layer 531.

In operation 1103, a shielding material may be printed on one surface (e.g., a surface that faces the +Z axis direction) of the hard coating layer 910 to form the shielding printing layer 541. The shielding printing layer 541 may be formed through a screen printing method.

In operation 1104, the optical adhesive layer 431 may be formed on an opposite surface (e.g., a surface that faces the −Z axis direction) of the first base plate 511. The glass plate 410 coupled to the first base plate 511 may be formed through the optical adhesive layer 431.

According to certain embodiments, the decorative member 900 may be manufactured through three processes, such as an imprinting process, a lamination process, and a printing process, thereby omitting a deposition process, and thus productivity may be increased.

According to certain embodiments, at least any one of the first molding pattern layer 521, the shielding printing layer 541, and the reflective adhesive layer 531 included in the decorative member 900 may be formed without using a deposition process, such as an E-beam evaporation. Accordingly, in certain embodiments, because a vacuum deposition facility of a high price is not utilized when the decorative member 900 is formed, investment costs may be reduced. Furthermore, in certain embodiments, because it is not necessary to form vacuum when the decorative member 900 is formed, reductions in productivity and yield rate may be avoided. Furthermore, because it is not necessary to control deposition thickness when the decorative member 900 is formed, a color reproducing performance may be prevented from being lowered.

Figure 12:
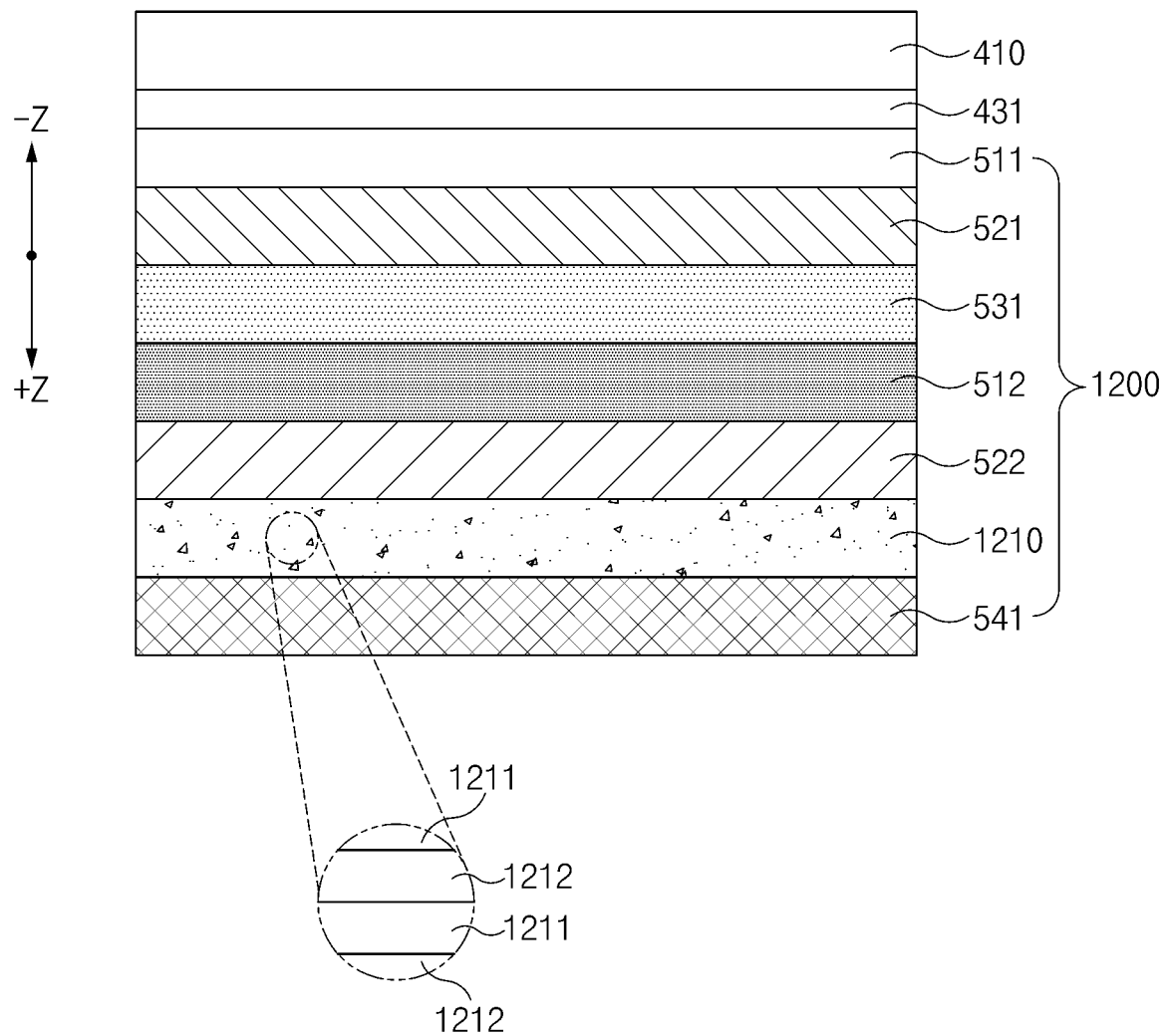
FIG. 12 is a cross-sectional view illustrating a third embodiment of a glass structure of an electronic device according to certain embodiments.
Figure 13:
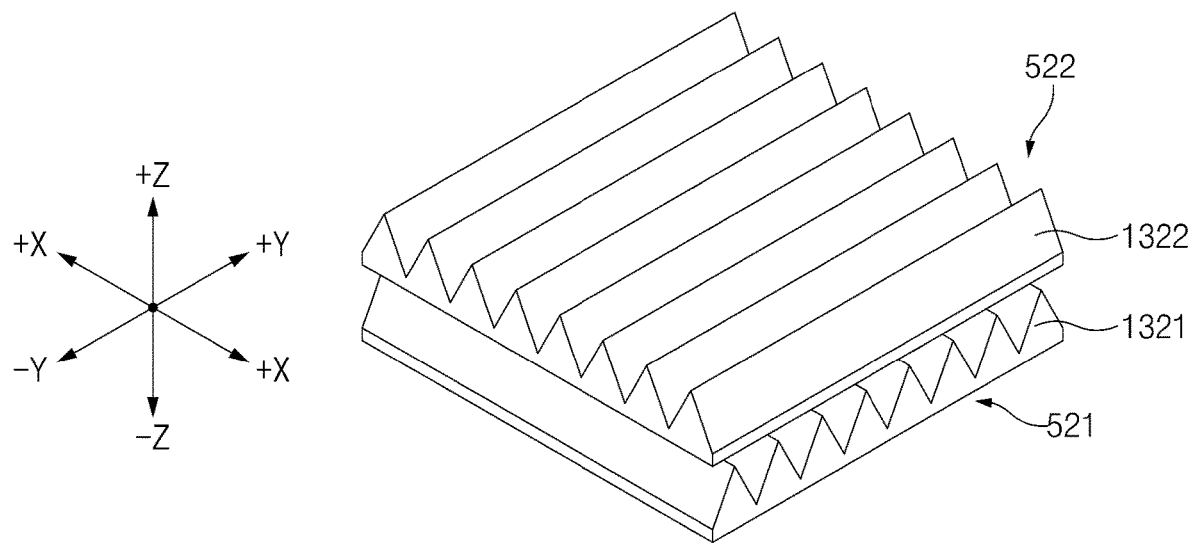
FIG. 13 is a view illustrating an embodiment of a first molding pattern layer and a second molding pattern layer included in the glass structure illustrated in FIG. 12.

FIG. 12 is a cross-sectional view illustrating a third embodiment of a glass structure 1300 of an electronic device according to certain embodiments. FIG. 13 is a view illustrating an embodiment of the first molding pattern layer 521 and a second molding pattern layer 522 included in the glass structure illustrated in FIG. 12. The glass plate 410, the optical adhesive layer 431, the first base plate 511, the first molding pattern layer 521, the reflective adhesive layer 531, the second base plate 512, and the shielding printing layer 541 of FIG. 12 are the same as those described with reference to FIGS. 4 to 7, and thus the same reference numerals are given and the same description will be omitted.

Referring to FIGS. 12 and 13, the glass structure 1300 may be formed by attaching a decorative member 1200 on one surface (e.g., a surface that faces the +Z axis direction) of the glass plate 410 through the optical adhesive layer 431.

The decorative member 1200 may include the first base plate 511, the first molding pattern layer 521, the reflective adhesive layer 531, the second base plate 512, the second molding pattern layer 522, a multi-deposition layer 1210 and the shielding printing layer 541.

According to an embodiment, the second molding pattern layer 522 may be disposed between the multi-deposition layer 1210 and the second base plate 512. One surface of the second molding pattern layer 522 may contact the multi-deposition layer 1210, and an opposite surface of the second molding pattern layer 522 may contact the second base plate 512. The second molding pattern layer 522 may be cured through an optical curing process (e.g., UV curing). The second molding pattern layer 522 may implement a texture on an outer surface of the glass structure 1300 through a diffraction or interference effect of light like the first molding pattern layer 521. In the second molding pattern layer 522, as illustrated in FIG. 13, a plurality of second 3-dimensional patterns 1322 may be regularly or irregularly formed in various designs. The plurality of second 3-dimensional patterns 1322 included in the second molding pattern layer 522 may be formed in 2D or 3D. The second 3-dimensional patterns 1322 may be formed in a lenticular pattern, a prism pattern, a pattern with a plurality of repeated stripes, or a pattern with a plurality of repeated dots. For example, the second molding pattern layer 522 may have a lattice structure, in which the plurality of second 3-dimensional patterns 1322 formed in a lenticular pattern are repeated.

According to an embodiment, the second 3-dimensional patterns 1322 of the second molding pattern layer 522 may be disposed to cross first 3-dimensional patterns 1321 of the first molding pattern layer 521. For example, the first 3-dimensional patterns 1321 may be formed long in a widthwise direction (e.g., the X axis direction) of the glass plate (e.g., the glass plate 410 of FIG. 12), and the adjacent first 3-dimensional patterns 1321 may be arranged in a row along a lengthwise direction (e.g., the Y axis direction) of the glass plate. The second 3-dimensional patterns 1322 may be formed long in a lengthwise direction (e.g., the Y axis direction) of the glass plate (e.g., the glass plate 410 of FIG. 12), and the adjacent second 3-dimensional patterns 1322 may be arranged in a row along a widthwise direction (e.g., the X axis direction) of the glass plate.

The second 3-dimensional patterns 1322 of the second molding pattern layer 522 and the first 3-dimensional patterns 1321 of the first molding pattern layer 521 may protrude in the same direction (e.g., a direction that faces the +Z axis direction). The second 3-dimensional patterns 1322 of the second molding pattern layer 522 may protrude from an opposite surface that contacts the second base plate 512 in a direction that faces the multi-deposition layer 1210.

According to an embodiment, the multi-deposition layer 1210 may be disposed between the second molding pattern layer 522 and the shielding printing layer 541. One surface of the multi-deposition layer 1210 may contact the shielding printing layer 541, and an opposite surface of the multi-deposition layer 1210 may contact the second molding pattern layer 522.

The multi-deposition layer 1210 may be formed by disposing a low-refraction layer 1211 and a high-refraction layer 1212 such that they alternate at least once. For example, the low-refraction layer 1211 may be formed of an oxide material such as $SiO_x$, and the high-refraction layer 1212 may be formed of a nitride material such as $SiN_x$.

Light may be reflected on an interface between the low-refraction layer 1211 and the high-refraction layer 1212 included in the multi-deposition layer 1210 due to a difference between the indices of refraction of the low-refraction layer 1211 and the high-refraction layer 1212. By adjusting the thicknesses and the number of the layers included in the multi-deposition layer 1210, light of a desired color (or texture) may be selectively reflected and output to an external environment of the electronic device. Because the multi-deposition layer 1210 has different indices of refraction for various wavelength bands, it may have various reflectivity for wavelength bands according to an intention of the user.

Because the multi-deposition layer 1210 reflects light due to the difference between the indices of refraction of the low-refraction layer 1211 and the high-refraction layer 1212, it may increase reflectivity. The multi-deposition layer 1210 may compensate for reduction of the reflectivity of the second 3-dimensional patterns of the second molding pattern layer 522 disposed at a location that is deeper than the first 3-dimensional patterns of the first molding pattern layer 521 with respect to the opposite surface of the glass plate 410.

According to certain embodiments, the multi-deposition layer 1210 may be formed to be thinner than the reflective adhesive layer 531. A total thickness of the decorative member 1200 of the embodiment including the multi-deposition layer 1210 may be prevented from becoming thicker than that of the decorative member of a comparative example, including a separate dummy reflective adhesive layer instead of the multi-deposition layer 1210.

Figure 14:
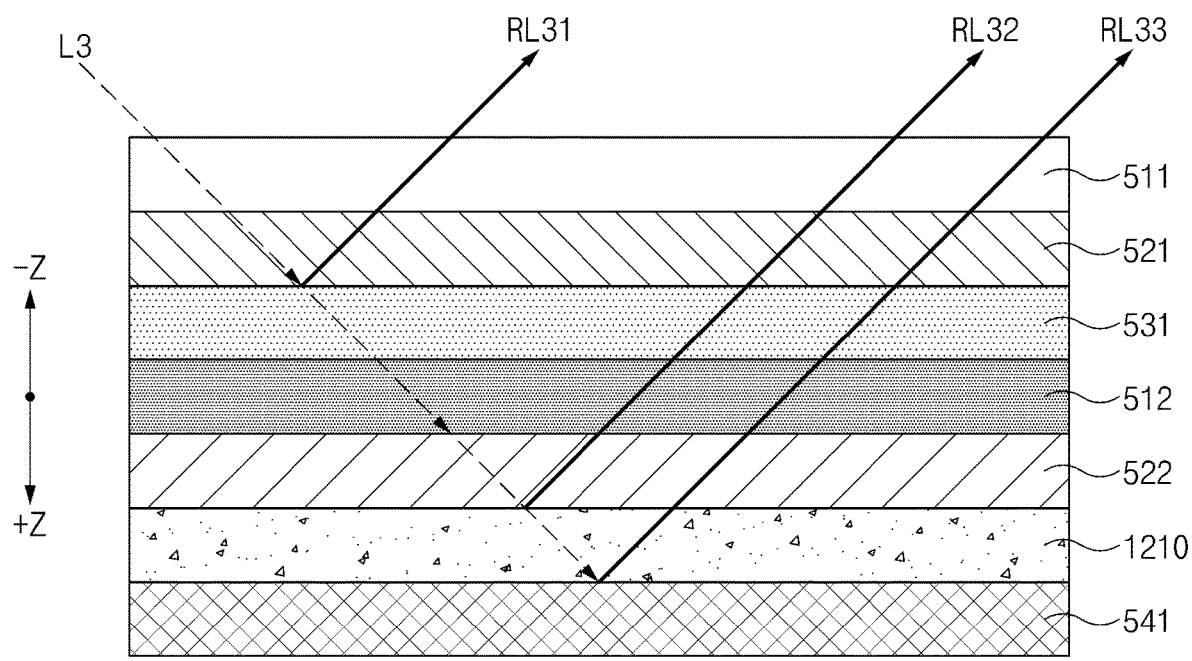
FIG. 14 is a view illustrating an output path of light that is input to a decorative member included in the glass structure illustrated in FIG. 12.

FIG. 14 is a view illustrating an output path of light that is input to the decorative member 1200 included in the glass structure according to certain embodiments.

Referring to FIG. 14, light from an external environment of the electronic device (e.g., the electronic device 101 of FIGS. 1 to 3) may be input to the glass structure (e.g., the glass structure 1300 of FIG. 12) including the second molding pattern layer 522 and the multi-deposition layer 1210. A portion of the input light L3 may pass through the first base plate 511 and the first molding pattern layer 521 to reach an interface between the first molding pattern layer 521 and the reflective adhesive layer 531. A portion of the input light L3 that reached the interface between the first molding pattern layer 521 and the reflective adhesive layer 531 may be reflected on the interface between the first molding pattern layer 521 and the reflective adhesive layer 531 due to a difference between the indices of refraction of the first molding pattern layer 521 and the reflective adhesive layer 531. A first reflected light RL31 reflected on the interface between the first molding pattern layer 521 and the reflective adhesive layer 531 may be output to the external environment of the electronic device through the glass structure 1300 to provide a visual effect to the user.

According to an embodiment, a portion of the input light L3 that reaches the interface between the second base plate 512 and the second molding pattern layer 522 may be refracted on the interface between the second base plate 512 and the second molding pattern layer 522. The refracted input light L3 may pass through the second molding pattern layer 522 and reach the interface between the second molding pattern layer 522 and the multi-deposition layer 1210. A portion of the input light L3 that reaches the interface may be reflected on the interface between the second molding pattern layer 522 and the multi-deposition layer 1210. A second reflected light RL32 reflected on the interface between the second molding pattern layer 522 and the multi-deposition layer 1210 may be output to the external environment of the electronic device through the glass structure 1300 to provide a visual effect that is visible to the user.

According to an embodiment, a portion of the input light L3 that reaches the interface between the second molding pattern layer 522 and the multi-deposition layer 1210 may be refracted on the interface between the second molding pattern layer 522 and the multi-deposition layer 1210. The refracted input light L3 may pass through the multi-deposition layer 1210 and reach the interface between the multi-deposition layer 1210 and the shielding printing layer 541. At least a portion of the input light L3 that reaches the interface may be reflected by the shielding printing layer 541. The third reflected light RL33 reflected by the shielding printing layer 541 may be output to the external environment of the electronic device through the glass structure 1300 to provide a visual effect to the user.

According to certain embodiments, through the glass plate (e.g., the glass plate 410 of FIG. 12), a color of the first reflected light RL31 reflected on the interface between the first molding pattern layer 521 and the reflective adhesive layer 531, a color of the second reflected light RL32 reflected on the interface between the second molding pattern layer 522 and the multi-deposition layer 1210, and a color of the third reflected light RL33 reflected by the shielding printing layer 541 may be together visible. Accordingly, through the glass structure (e.g., the glass structure 1300 of FIG. 12), a visual effect including least three different colors may be provided to the user. Light of a desired color may be selectively reflected and output by adjusting a thickness and the number of layers of at least one of the first base plate 511, the second base plate 512, the first molding pattern layer 521, the second molding pattern layer 522, the reflective adhesive layer 531, the multi-deposition layer 1210, and the shielding printing layer 541 included in the decorative member 1200.

According to certain embodiments, the glass plate 410, the optical adhesive layer 431, the first base plate 511, and the first molding pattern layer 521 may be formed to have the same or similar indices of refraction. Accordingly, light may not be reflected or an amount of reflected light may be reduced on the interface between the glass plate 410 and the optical adhesive layer 431, the interface between the optical adhesive layer 431 and the first base plate 511, and the interface between the first base plate 511 and the first molding pattern layer 521, and thus may not be recognized by the user. Furthermore, the reflective adhesive layer 531, the second base plate 512, and the second molding pattern layer 522 may be formed to have the same or similar indices of refraction. Accordingly, light may not be reflected or an amount of reflected light may be reduced on the interface between the reflective adhesive layer 531 and the second base plate 512 and the interface between the second base plate 512 and the second molding pattern layer 522, whereby the light is not visible to the user.

Figure 15:
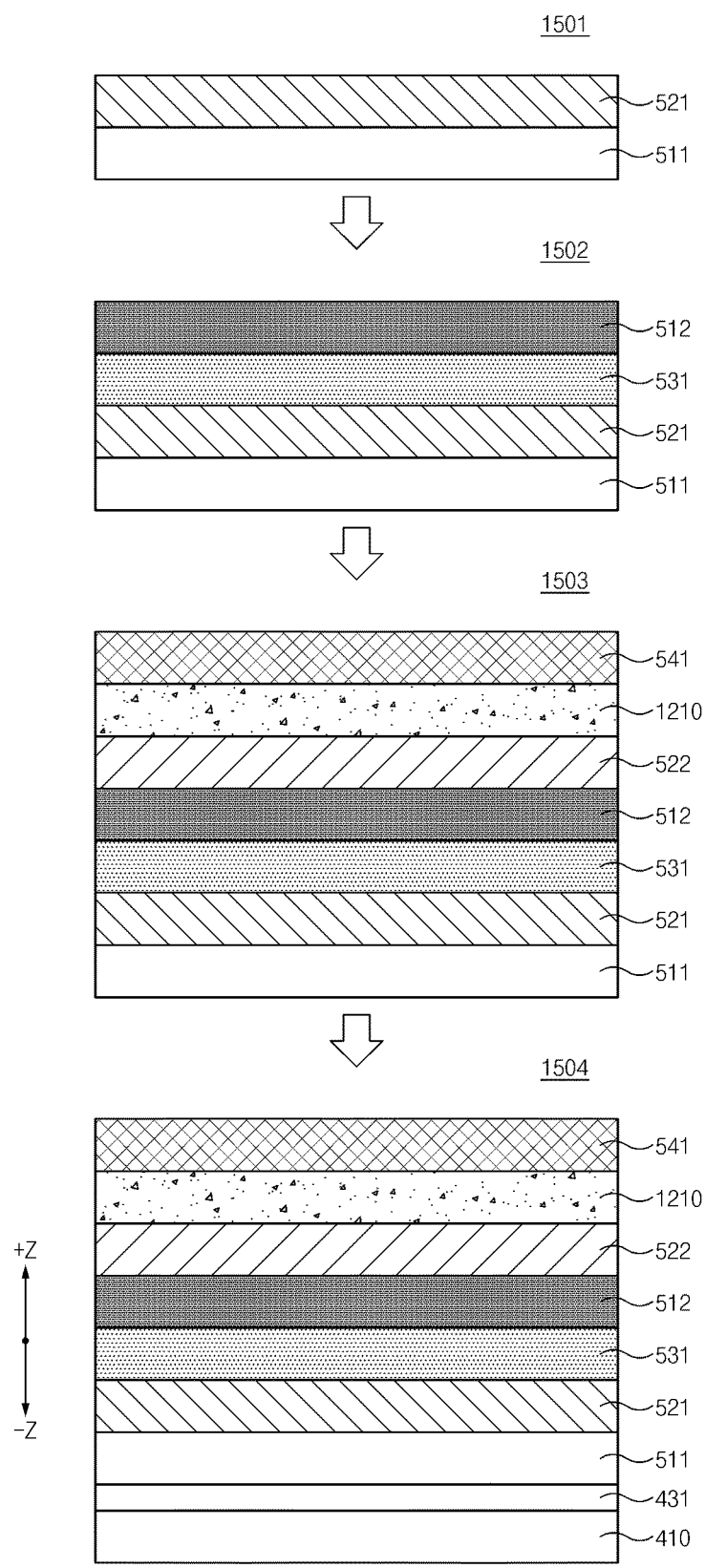
FIG. 15 is a view illustrating a method for manufacturing the glass structure illustrated in FIG. 12.

FIG. 15 is a view illustrating a method for manufacturing the glass structure illustrated in FIG. 12.

In operation 1501, an optically curing resin may be applied on one surface (e.g., a surface that faces the +Z axis direction) of the first base plate 511. The applied optically curing resin may be optically cured after being imprinted through the optical pattern mold to form the first molding pattern layer 521.

In operation 1502, a film or a liquid type adhesive is applied onto an opposite surface (e.g., a surface that faces the −Z axis direction) of the second base plate 512 to form the reflective adhesive layer 531. The second base plate 512, in which the reflective adhesive layer 531 is formed on the opposite surface, may be laminated on the first molding pattern layer 521.

According to another embodiment, a film or a liquid type adhesive is applied onto one surface (e.g., a surface that faces the +Z axis direction) of the first molding pattern layer 521 to form the reflective adhesive layer 531. The second base plate 512 may be laminated on one surface of the reflective adhesive layer 531.

In operation 1503, an optically curing resin may be applied on one surface (e.g., a surface that faces the +Z axis direction) of the second base plate 512. The applied optically curing resin may be optically cured after being imprinted through the optical pattern mold to form the second molding pattern layer 522. As the low-refraction layer and the high-refraction layer are laminated on the second molding pattern layer 522 alternately at least once, the multi-deposition layer 1210 may be formed. As a shielding material is printed on the multi-deposition layer 1210, the shielding printing layer 541 may be formed. The shielding printing layer 541 may be formed through a screen printing method.

In operation 1504, the optical adhesive layer 431 may be formed on an opposite surface (e.g., a surface that faces the −Z axis direction) of the first base plate 511. The glass plate 410 may be formed to be coupled to the first base plate 511 through the optical adhesive layer 431.

Figure 16:
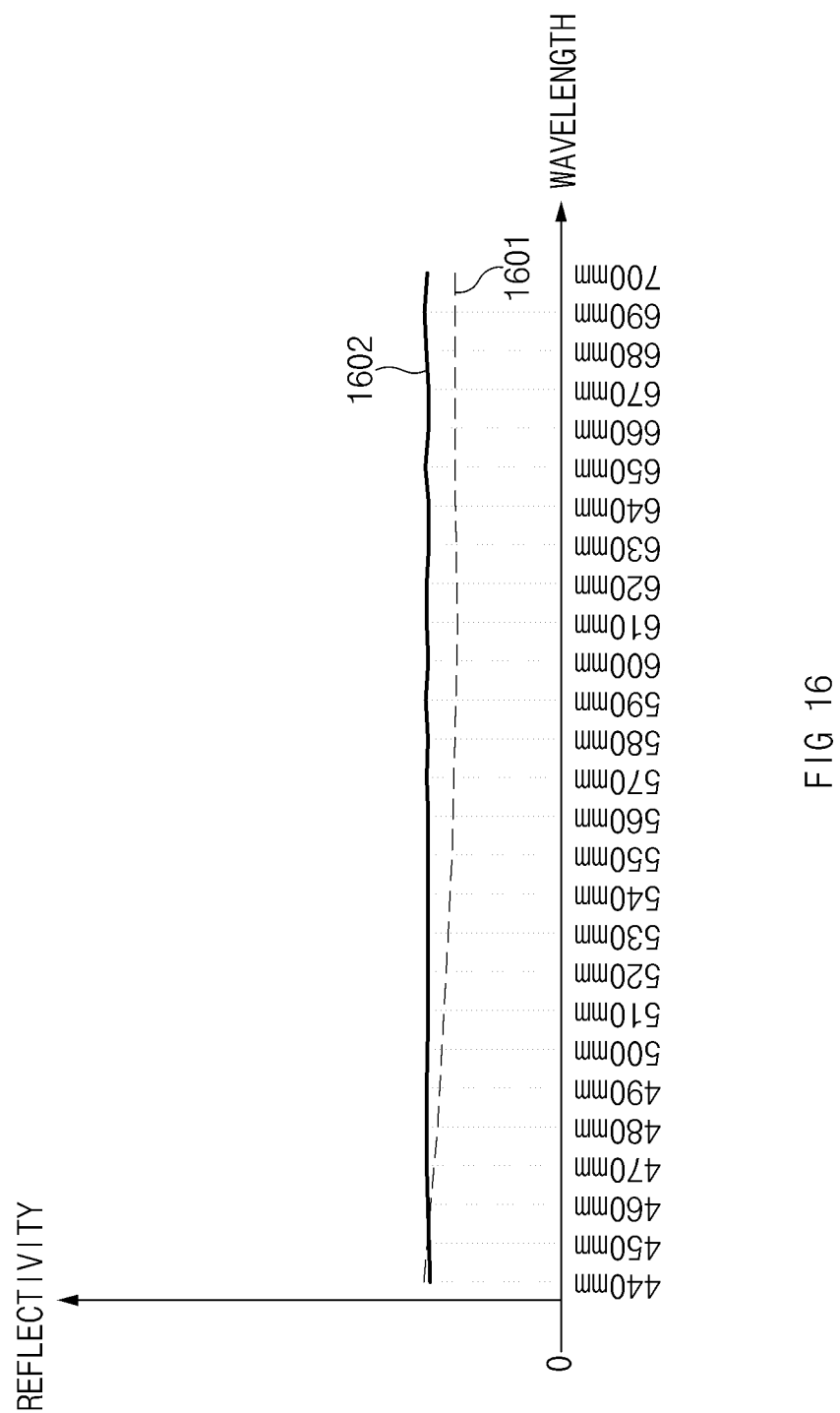
FIG. 16 is a view illustrating reflectivity characteristics of decorative members of an electronic device according to a comparative example and an embodiment.

FIG. 16 is a view illustrating reflectivity characteristics of decorative members of an electronic device according to a comparative example and an embodiment.

Referring to FIG. 16, line 1601 depicts reflectivity performance for wavelengths of a comparative example including a decorative member, in which a multi-deposition layer formed through a deposition process and a molding pattern layer contact each other, and line 1602 depicts reflectivity performances for wavelengths of an embodiment of the disclosure including a decorative member (e.g., the decorative member 500 of FIG. 5), in which a reflective adhesive layer formed through a non-deposition process (e.g., a printing process) and a molding pattern layer contact each other. At a wavelength band of a visual ray, the reflective performances of the decorative member according to the embodiment are similar to or higher than the reflective performances of the decorative member according to the comparative example. For example, at the wavelength of 440 nm to 450 nm, the reflectivity performances of the decorative member according to the embodiment may be similar to the reflectivity performances of the decorative member according to the comparative example. At the wavelength of 450 nm to 700 nm, the reflectivity performances of the decorative member according to the embodiment may be higher than the reflectivity performances of the decorative member according to the comparative example.

According to an embodiment, the decorative member (e.g., the decorative member 500 of FIG. 5, the decorative member 900 of FIG. 9, and/or the decorative member 1200 of FIG. 12) may provide a visual effect visible to the user through the glass structure (e.g., the glass structure 400 of FIG. 5).

According to an embodiment, the decorative member may provide various visual effects through a pattern effect of at least one molding pattern layer and a light reflection effect on an interface between the molding pattern layer and a reflective adhesive layer and on the shielding printing layer without any separate deposition layer. For example, the decorative member may provide various visual effects such as a color lattice effect, a gradation effect, or a hologram effect, which use at least two colors.

According to an embodiment, the decorative member (e.g., the decorative member 1200 of FIG. 12) may implement a dual molding pattern effect through a combination of a pattern effect of the first molding pattern layer (e.g., the first molding pattern layer 521 of FIG. 12) and the second molding pattern layer (e.g., the second molding pattern layer 522 of FIG. 12), and a light reflection effect of the multi-deposition layer (e.g., the multi-deposition layer 1210 of FIG. 12).

According to an embodiment, the decorative member (e.g., the decorative member 1200 of FIGS. 12 and 13) may include the first molding pattern layer (e.g., the first molding pattern layer 521 of FIGS. 12 and 13) and the second molding pattern layer (e.g., the second molding pattern layer 522 of FIGS. 12 and 13) that are disposed to cross each other. A visual effect implemented through the decorative member at a front viewing angle of field, and a visual effect implemented through the decorative member at a side viewing angle of may be different. For example, the first 3-dimensional pattern of the first molding pattern layer and the second 3-dimensional pattern of the second molding pattern layer in a range of the front viewing angle of field may be visible. At least a portion of the first 3-dimensional pattern of the first molding pattern layer and at least a portion of the second 3-dimensional pattern of the second molding pattern layer may be visible in a range of the side viewing angle of field. Accordingly, the decorative member including the first molding pattern layer and the second molding pattern layer may implement a dual pattern effect.

Certain embodiments of the disclosure are not intended to limit the technical features described in the disclosure to the specific embodiments, and may be modified in various forms without departing from the essential characteristics disclosed in the disclosure. The elements and coupling relationships of the first to third embodiments of the glass structure are not independent, and all or some of the first to third embodiments may be coupled to and combined with each other to be carried out. For example, in the first to third embodiments of the glass structure 400, 1000, and 1300 illustrated in FIGS. 5, 9, and 12, the first base plate 511 may be replaced by the hard coating layer 910 of the second embodiment illustrated in FIG. 9. As another example, in the third embodiment of the glass structure 1300 illustrated in FIG. 12, the multi-deposition layer 1210 of the third embodiment may be further disclosed between at least any one of the reflective adhesive layer 531 and the first base plate 511, and the first molding pattern layer 521.

A rear plate that covers a rear surface of an electronic device according to certain embodiments disclosed in the disclosure includes a glass plate, and the first base plate 511 attached to one surface of the glass plate, the second base plate 512 disposed to be spaced apart from the first base plate, the first molding pattern layer 521 disposed on one surface of the first base plate, and including a plurality of first 3-dimensional patterns protruding toward the second base plate, the first adhesive layer 531 disposed between the first molding pattern layer and an opposite surface of the second base plate, and an index of refraction of which is different from an index of refraction of the first molding pattern layer such that at least a portion of light that is input through the first molding pattern layer is reflected on an interface with the first molding pattern layer; and the shielding printing layer 541 disposed on one surface of the second base plate.

According to certain embodiments, the index of refraction of the first molding pattern layer 521 may be lower than that of the first adhesive layer.

According to certain embodiments, a difference between the indices of refraction of the first molding pattern layer and the first adhesive layer is 0.1 or more.

According to certain embodiments, the first adhesive layer 531 may be formed of at least any one of an optical clear adhesive (OCA) and an optical clear resin (OCR).

According to certain embodiments, at least any one of the first base plate 511 and the second base plate 512 may be formed of at least any one of PET and PC.

According to certain embodiments, the second base plate 512 may be formed of a hard-coating material having a hardness that is higher than that of the first base plate, and a thickness of the second base plate 512 is smaller than a thickness of the first base plate.

According to certain embodiments, the rear plate may include a second adhesive layer 431 disposed between the glass plate and the first base plate, and at least any one of the first base plate 511, the second base plate 512/910, the first adhesive layer 531, the shielding printing layer 541, and the first molding pattern layer 521 may have a transparent or opaque color.

According to certain embodiments, the rear plate may further include a second molding pattern layer 522 disposed between the second base plate and the shielding printing layer, and the multi-deposition layer 1210 disposed between the second molding pattern layer and the shielding printing layer, and an index of refraction of which is different from that of the second molding pattern layer.

According to certain embodiments, the second molding pattern layer 522 may include the plurality of second 3-dimensional patterns 1322 that cross the plurality of first 3-dimensional patterns 1321.

According to certain embodiments, the rear plate may further include a second adhesive layer 431 disposed between the glass plate and the first base plate, and at least any one of the first base plate 511, the second base plate 512, the first adhesive layer 531, the second adhesive layer 431, the shielding printing layer 541, the first molding pattern layer 521, the second molding pattern layer 522, and the multi-deposition layer 1210 may have a transparent or opaque color.

An electronic device according to an embodiment disclosed the disclosure includes a housing including a front plate, a rear plate facing an opposite direction to the front plate, and a side structure surrounding a space between the front plate and the rear plate, and a display viewed through at least a portion of the front plate, the rear plate (e.g., glass structure 400) may include the glass plate 410, and a decorative member 500 attached to the glass plate and facing the display, and the decorative member 500 may include the first base plate 511 attached to one surface of the glass plate, the second base plate 512 disposed to be spaced apart from the first base plate, the first molding pattern layer 521 disposed on one surface of the first base plate, and including a plurality of 3-dimensional patterns protruding toward the display, the first adhesive layer 531 disposed between the first molding pattern layer and an opposite surface of the second base plate, and an index of refraction of which is different from an index of refraction of the first molding pattern layer such that at least a portion of light that is input through the first molding pattern layer is reflected on an interface with the first molding pattern layer, and the shielding printing layer 541 disposed on one surface of the second base plate.

According to certain embodiments, the index of refraction of the first molding pattern layer 521 may be lower than that of the first adhesive layer 531.

According to certain embodiments, the first adhesive layer 531 may be formed of at least any one of an optical clear adhesive (OCA) and an optical clear resin (OCR).

According to certain embodiments, at least any one of the first base plate and the second base plate may be formed of at least any one of PET and PC, and the remaining one of the first base plate and the second base plate may be formed of at least any one of PET and PC, or may be formed of a hard-coating material having a hardness that is higher than that of the first base plate.

According to certain embodiments, the electronic device may include the second molding pattern layer 522 including a plurality of second 3-dimensional patterns that cross the plurality of first 3-dimensional patterns and disposed between the second base plate and the shielding printing layer, and the multi-deposition layer 1210 disposed between the second molding pattern layer and the shielding printing layer, and an index of refraction of which is different from that of the second molding pattern layer.

A method for a rear plate that covers a rear surface of an electronic device according to certain embodiments disclosed in the disclosure includes an operation 801 of forming the first molding pattern layer 521 including a plurality of first 3-dimensional patterns on one surface of a first base plate 511, operation 802 of forming a first adhesive layer, an index of refraction of which is different from that of the first molding pattern layer 531, on an opposite surface of a second base plate 512, and laminating the second base plate on one surface of the first molding pattern layer such that the first adhesive layer and the first molding pattern layer contact each other, and an operation 803 of forming a shielding printing layer 541 on one surface of the second base plate, and at least a portion of light that is input through the first molding pattern layer 521 may be reflected on an interface between the first molding pattern layer 521 and the first adhesive layer 531.

According to certain embodiments, the index of refraction of the first molding pattern layer 521 may be lower than that of the first adhesive layer 531.

According to certain embodiments, the first adhesive layer 531 may be formed of at least any one of an optical clear adhesive (OCA) and an optical clear resin (OCR).

According to certain embodiments, at least any one of the first base plate 511 and the second base plate 512 may be formed of at least any one of PET and PC, and the remaining one of the first base plate 511 and the second base plate 512 may be formed of at least any one of PET and PC, and may be formed of a hard-coating material having a hardness that is higher than that of the first base plate.

According to certain embodiments, the method may further include an operation 1503 of forming the second molding pattern layer 522 including a plurality of second 3-dimensional patterns that cross the plurality of first 3-dimensional patterns and disposed between the second base plate and the shielding printing layer, and forming a multi-deposition layer 1210, an index of refraction of which is different from that of the second molding pattern layer 522, between the second molding pattern layer 522 and the shielding printing layer 541.

What is claimed is:
1. A rear plate covering a rear surface of an electronic device, the rear plate comprising:
 a glass plate;
 a first base plate attached to one surface of the glass plate;
 a second base plate disposed so as to be spaced apart from the first base plate;

a first molding pattern layer disposed on one surface of the first base plate, including a plurality of first 3-dimensional (3D) patterns protruding toward the second base plate;

a first adhesive layer disposed between the first molding pattern layer and an opposite surface of the second base plate, wherein an index of refraction of the first adhesive layer is different from an index of refraction of the first molding pattern layer, such that at least a portion of light input through the first molding pattern layer is reflected on an interface with the first molding pattern layer; and a shielding printing layer disposed on one surface of the second base plate.

2. The rear plate of claim 1, wherein the index of refraction of the first molding pattern layer is lower than an index of refraction of the first adhesive layer.

3. The rear plate of claim 1, wherein a difference between the indices of refraction of the first molding pattern layer and the first adhesive layer is 0.1 or more.

4. The rear plate of claim 1, wherein the first adhesive layer is formed of at least one of an optical clear adhesive (OCA) and an optical clear resin (OCR).

5. The rear plate of claim 1, wherein at least one of the first base plate and the second base plate is formed of at least one of polyethylene terephthalate (PET) and polycarbonate (PC).

6. The rear plate of claim 1, wherein the second base plate is formed of a hard-coating material having a hardness higher than that of the first base plate, and
wherein a thickness of the second base plate is smaller than a thickness of the first base plate.

7. The rear plate of claim 1, further comprising:
a second adhesive layer disposed between the glass plate and the first base plate,
wherein at least one of the first base plate, the second base plate, the first adhesive layer, the shielding printing layer, and the first molding pattern layer includes a transparent or opaque color.

8. The rear plate of claim 1, further comprising:
a second molding pattern layer disposed between the second base plate and the shielding printing layer; and
a multi-deposition layer disposed between the second molding pattern layer and the shielding printing layer, the multi-deposition layer having an index of refraction different from an index of refraction of the second molding pattern layer.

9. The rear plate of claim 8, wherein the second molding pattern layer includes a plurality of second 3D patterns that cross the plurality of first 3D patterns.

10. The rear plate of claim 8, further comprising:
a second adhesive layer disposed between the glass plate and the first base plate,
wherein at least any one of the first base plate, the second base plate, the first adhesive layer, the second adhesive layer, the shielding printing layer, the first molding pattern layer, the second molding pattern layer, and the multi-deposition layer includes a transparent or opaque color.

11. An electronic device, comprising:
a housing including a front plate, a rear plate facing an opposite direction to the front plate, and a side structure surrounding a space formed between the front plate and the rear plate; and
a display visible through at least a portion of the front plate,
wherein the rear plate includes:

a glass plate, and
a decorative member attached to the glass plate and facing the display; and
wherein the decorative member includes:
a first base plate attached to one surface of the glass plate,
a second base plate disposed so as to be spaced apart from the first base plate,
a first molding pattern layer disposed on one surface of the first base plate, and including a plurality of first 3-dimensional (3D) patterns protruding toward the display,
a first adhesive layer disposed between the first molding pattern layer and
an opposite surface of the second base plate, wherein an index of refraction of the first adhesive layer is different from an index of refraction of the first molding pattern layer such that at least a portion of light that is input through the first molding pattern layer is reflected on an interface with the first molding pattern layer; and
a shielding printing layer disposed on one surface of the second base plate.

12. The electronic device of claim 11, wherein the index of refraction of the first molding pattern layer is lower than an index of refraction of the first adhesive layer.

13. The electronic device of claim 11, wherein the first adhesive layer is formed of at least one of an optical clear adhesive (OCA) and an optical clear resin (OCR).

14. The electronic device of claim 11, wherein at least one of the first base plate and the second base plate is formed of at least one of polyethylene terephthalate (PET) and polycarbonate (PC), and
wherein a remaining one of the first base plate and the second base plate is formed of at least one of PET, PC, or a hard-coating material having a hardness that is higher than a hardness of the first base plate.

15. The electronic device of claim 11, further comprising:
a second molding pattern layer including a plurality of second 3D patterns that cross the plurality of first 3D patterns, the second molding pattern layer disposed between the second base plate and the shielding printing layer; and
a multi-deposition layer disposed between the second molding pattern layer and the shielding printing layer, the multi-deposition layer having an index of refraction different from an index of refraction of the second molding pattern layer.

16. A method for manufacturing a rear plate for covering a rear surface of an electronic device, the method comprising:
forming a first molding pattern layer including a plurality of first 3-dimensional (3D) patterns on one surface of a first base plate;
forming a first adhesive layer on an opposite surface of a second base plate, the first adhesive layer having an index of refraction different from an index of refraction of the first molding pattern layer;
laminating the second base plate on one surface of the first molding pattern layer such that the first adhesive layer and the first molding pattern layer contact each other; and
forming a shielding printing layer on one surface of the second base plate, wherein at least a portion of light that is input through the first molding pattern layer is reflected on an interface between the first molding pattern layer and the first adhesive layer.

17. The method of claim 16, wherein the index of refraction of the first molding pattern layer is lower than that of the first adhesive layer.

18. The method of claim 16, wherein the first adhesive layer is formed of at least any one of an optical clear adhesive (OCA) and an optical clear resin (OCR).

19. The method of claim 16, wherein at least any one of the first base plate and the second base plate is formed of at least any one of polyethlene terephthalate (PET) and polycarbonate (PC), and wherein a remaining one of the first base plate and the second base plate is formed of at least any one of PET and PC, or is formed of a hard-coating material having a hardness that is higher than that of the first base plate.

20. The method of claim 16, further comprising:

forming a second molding pattern layer including a plurality of second 3-dimensional patterns that cross the plurality of first 3-dimensional patterns and disposed between the second base plate and the shielding printing layer; and forming a multi-deposition layer, an index of refraction of which is different from that of the second molding pattern layer, between the second molding pattern layer and the shielding printing layer.

\* \* \* \* \*